United States Patent [19]

Takahashi et al.

[11] Patent Number: 5,608,441
[45] Date of Patent: Mar. 4, 1997

[54] THERMAL-TRANSFER RECORDING PROCESS

[75] Inventors: Yonosuke Takahashi; Fumiaki Shinozaki, both of Shizuoka, Japan

[73] Assignee: Fuji Photo Film Co., Ltd., Kanagawa, Japan

[21] Appl. No.: 628,140

[22] Filed: Apr. 4, 1996

Related U.S. Application Data

[62] Division of Ser. No. 134,882, Oct. 13, 1993, Pat. No. 5,534,905.

[30] Foreign Application Priority Data

Oct. 13, 1992 [JP] Japan ................................. 4-301807
Nov. 17, 1992 [JP] Japan ................................. 4-330927

[51] Int. Cl.⁶ .................................................. B41M 5/26
[52] U.S. Cl. ........................... 347/171; 347/217; 347/221
[58] Field of Search ............................... 347/221, 217, 347/171; 400/120.01; 503/227

[56] References Cited

U.S. PATENT DOCUMENTS 5,061,093  10/1991  Yamaguchi et al. ................. 347/171

Primary Examiner—Huan H. Tran
Attorney, Agent, or Firm—Sughrue, Mion, Zinn, Macpeak & Seas

[57] ABSTRACT

Disclosed is a thermal-transfer recording process employing a transfer material and a image-receiving sheet. The transfer material comprises a support film and an image forming layer containing a coloring material and an organic polymer, and the image-receiving sheet comprises a substrate and a photopolymerizable or photosensitive thermal-adhesive layer. The process comprises placing the transfer material on the image-receiving sheet to form a composite; imagewise heating the surface of the support film of the composite using a thermal head; separating the transfer material from the image-receiving sheet leaving the image forming layer in the heated area on the photopolymerizable or photosensitive thermal-adhesive layer to form a colored replica image on the image-receiving layer; and either exposing the whole surface of the photopolymerizable thermal-adhesive layer to radiation to cure the photopolymerizable thermal-adhesive layer; or exposing the whole surface of the photosensitive thermal-adhesive layer and the image forming layer to UV-rays and treating the exposed layer with a developing solution to remove the exposed layer in the area having no colored replica image thereon.

5 Claims, 7 Drawing Sheets

THERMAL-TRANSFER RECORDING PROCESS

This is a divisional of application Ser. No. 08/134,882 filed Oct. 13, 1993, now U.S. Pat. No. 5,534,905.

FIELD OF THE INVENTION

This invention relates to a thermal-transfer recording process in which an accurate image can be easily recorded by means of a thermal head according to recording digital signals. The invention particularly relates to a thermal-transfer recording process capable of forming a distinct color image, a masking film, a color proof, a manuscript for phototype setting or a printing plate in the field of printing.

BACKGROUND OF THE INVENTION

There are known processes for transfer of sublimation-type dye and a process for transfer of heat-melting layer containing pigment, as a process for preparing a color image or masking film by recording digital signals by means of a thermal head.

The process for transfer of sublimation-type dye comprises a step of superposing a transfer sheet comprising a support film and an image forming layer (transfer layer) containing a sublimation-type dye and a binder thereon on an image-receiving sheet; a step of imagewise heating a surface of the support film side of the transfer sheet by the means of thermal head; and a step of subliming the dye to transfer it to the image-receiving sheet, whereby forming an image on the image-receiving sheet. Performance of the process for transfer of sublimation-type dye using transfer sheets of four colors (Y, M, C, B) enables formation of a color image and the resultant image is greatly improved in image quality.

The process for transfer of sublimation-type dye, however, has the following disadvantages:

1) the sublimation-type dye employed in the process is not suitable for recording material using thermal head showing high resolution because of its low sensitivity;

2) the dye is high expensive;

3) the process utilizes both area gradation and density gradation for tone reproduction so that it is not suitable for use in the field of printing because the tone reproduction in the field of printing (e.g., color proof) is expressed by only area gradation; and 4) edge-sharpness and durability of image formed by the process are not satisfied owing to transfer mechanism utilizing sublimation of dye for formation of image.

Particularly, unsatisfied edge-sharpness brings about serious drawback in quality of a letter image.

The process for transfer of heat-fusion layer containing pigment (thermal-transfer recording process) comprises a step of superposing a transfer sheet comprising a support in the form of a film and an image forming layer (a heat-fusion transfer layer) containing a pigment and a binder thereon on an image-receiving sheet; a step of imagewise heating a surface of the support side of the transfer sheet by the means of thermal head; and a step of fusing the image forming layer in the heated portion to bond it to the image-receiving sheet, whereby an image is formed on the image-receiving sheet. Similarly in the process for transfer of heat-fusion layer containing pigment, use of transfer sheets of four colors (Y, M, C, B) having different hues from each other enables formation of a color image.

The process for transfer of the image forming layer (heat-fusion transfer layer) containing pigment has the advantages that heat-sensitivity of the image forming layer is high, materials of the image forming layer are at a low price and the formed image has high durability as compared with the above process for transfer of sublimation-type dye. However, the image obtained by the process does not sufficiently satisfy the image quality and following-up property of the image forming layer for an uneven surface, and particularly the color image obtained by the process has unsatisfactory quality.

To solve the above problems, Japanese Patent Provisional Publication No. 4(1992)-99692 has proposed, as a masking film element, use of a thermal-transfer recording material which comprises a support and an image forming layer (a heat-sensitive transfer layer) provided thereon.

In the process, the image forming layer of the heat-sensitive transfer material is imagewise heated via a surface of a thin image-receiving film, i.e., a thermal head for heating is placed on the surface of the thin image-receiving film, and the image forming layer in the heated area is transferred to the image-receiving film. Usually, the image-receiving film to which the image forming layer is transferred is employed as a masking film, because bonding strength between the image-receiving sheet and the image forming layer is greater than that between the transparent support and the image forming layer. In the process, however, the transparent support having a thick thickness on which the image forming layer in the unheated area is left is employed as a masking film in order to render handling of the masking film easy. Hence, the masking film has drawbacks that the masking portion (image portion) is apt to peel of in using or handling the film.

Further, to solve the above problems, use of a sheet which comprises a support and an image-receiving layer comprising resin or wax provided thereon as an image-receiving sheet has been proposed (Japanese Patent Provisional Publications No. 60(1985)-225793, No. 63(1988)-82786 and No. 4(1992)-131285).

Japanese Patent Provisional Publications No. 60(1985)-225793 discloses use of various waxes (e.g., wax, paraffin wax, higher fatty acid, ester thereof and ester wax) as materials of the image-receiving layer. Japanese Patent Provisional Publications No. 63(1988)-82786 discloses use of butyral resin as a material of both the image-receiving layer and the image forming layer (thermal-transfer layer). Japanese Patent Provisional Publications No. 4(1992)-131285 discloses use of a combination of a wax such as chlorinated polyolefin, paraffin wax or chlorinated products thereof and a resin such as polyvinyl chloride, polyester or polycarbonate as materials of the image-receiving layer.

In the thermal-transfer recording process using the image-receiving sheet having the image-receiving layer of resin or wax as mentioned above, the image forming layer of the transfer material is easily and accurately transferred onto the image-receiving layer (image-receiving sheet) under heating as compared with the process using the image-receiving sheet with no image-receiving layer. However, the obtained image is not sufficiently satisfied in quality due to unsatisfactory transferring property (heat-sensitivity), and otherwise the image is apt to be scratched because of low hardness of the image. In more detail, if the image-receiving layer is designed to enhance transferring property, the resultant image is apt to be scratched. In contrast, if the image-receiving layer is designed to prevent the resultant image from being scratched, the transferring property is reduced.

SUMMARY OF THE INVENTION

As described above, the masking film described in Japanese Patent Provisional Publication No. 4(1992)-99692 has an increased thickness so that the masking film exhibits good handling. However, a bonding strength between the image forming layer and the transparent support is designed to be small and therefore the masking portion (image portion) of the heat-sensitive transfer layer is apt to peel off in handling of the film.

Further, the thermal-transfer recording process using the image-receiving sheet having the image-receiving layer is improved in transferring property, but the obtained image is not sufficiently satisfied in quality and is apt to be scratched because of low hardness of the image.

In the present invention, the photopolymerizable or photosensitive thermal-adhesive layer on the substrate (which will become a masking film) contains a photopolymerizable or photosensitive monomer which serves as plasticizer, so that the thermal-adhesive layer is easily softened or fused by heating to strongly bond the image forming layer in the heated portion. Further, the photopolymerizable or photosensitive monomer is cured or decomposed through exposure so that the thermal-adhesive layer (image-receiving layer) is free from tackiness or is removed whereby the substrate appears. Hence, the obtained masking film has an increased thickness and shows a high sensitivity, a high image quality and a good scuff resistance.

An object of the invention is to provide a thermal-transfer recording process in which a color image having a high image quality and a good durability, or a masking film having a distinct image of high density can be easily and inexpensively prepared without trouble in handling.

Another object of the invention is to provide a thermal-transfer recording process in which an image having a high image quality can be easily formed by means of a thermal head according to recording digital signals.

A further object of the invention is to provide a thermal-transfer recording process which can simplify a system for preparing a printing plate and can reduce cost for the system.

A furthermore object of the invention is to provide a thermal-transfer recording process which can be advantageously employed for preparing a printing plate which is capable of recording high quality image using a digital signal, and has excellent printing characteristics and good durability in repetition of printing.

There is provided by the present invention a thermal-transfer recording process (A) comprising the steps of:

(1) placing a transfer material comprising a support film and an image forming layer provided thereon which contains a coloring material and an organic polymer on an image-receiving sheet comprising a substrate and a photopolymerizable thermal-adhesive layer in such a manner that the image forming layer and the photopolymerizable thermal-adhesive layer come into contact with each other, to form a composite;

(2) imagewise heating the surface of the support film side of the composite using a thermal head to increase a bonding strength between the image forming layer and the photopolymerizable thermal-adhesive layer in the heated area;

(3) separating the transfer material from the image-receiving sheet leaving the image forming layer in the heated area on the photopolymerizable thermal-adhesive layer to form a colored replica image on the image-receiving sheet; and (4) exposing the whole photopolymerizable thermal-adhesive layer to radiation to cure the photopolymerizable thermal-adhesive layer on the image receiving sheet.

Preferred embodiments of the process (A) of the invention are as follows:

1) The thermal-transfer recording process wherein the support film has a thickness of 2 to 30 μm.

2) The thermal-transfer recording process wherein the substrate has a thickness of 50 to 1,000 μm.

3) The thermal-transfer recording process wherein the photopolymerizable thermal-adhesive layer sensitizes in a wavelength region of not more than 450 nm.

4) The thermal-transfer recording process wherein the photopolymerizable thermal-adhesive layer in the unheated portion having been cured has a transmittance density of not more than 0.5 in a wavelength region of 350 to 450 nm.

5) The thermal-transfer recording process wherein the image forming layer has a thickness of 0.1 to 1.5 μm.

6) The thermal-transfer recording process wherein the image forming layer contains a pigment having a particle size of not more than 1.0 μm in the amount of 70 weight % based on the total amount of the coloring material.

7) The thermal-transfer recording process wherein the photopolymerizable thermal-adhesive layer in the unheated area having been cured has a transmittance density of not more than 0.5 in a wavelength region of 350 to 450 nm and the image-receiving sheet is essentially transparent.

8) The thermal-transfer recording process wherein the organic polymer of the image forming layer is polyvinyl butyral.

Further, there is provided by the present invention a thermal-transfer recording process (B) comprising the steps of:

(1) preparing at least two transfer materials comprising a support film and an image forming layer provided thereon which contains a coloring material and an organic polymer, the transfer materials having image forming layers which have hues different from each other, and placing one of the transfer materials on an image-receiving sheet comprising a substrate and a photopolymerizable thermal-adhesive layer provided thereon in such a manner that the image forming layer and the photopolymerizable thermal-adhesive layer come into contact with each other, to form a composite;

(2) imagewise heating the surface of the support film side of the composite using a thermal head to increase a bonding strength between the image forming layer and the photopolymerizable thermal-adhesive layer in the heated area;

(3) separating the transfer material from the image-receiving sheet leaving the image forming layer in the heated area on the photopolymerizable thermal-adhesive layer to form a colored replica image on the image-receiving sheet;

(4) repeating the steps (1) to (3) using the image-receiving sheet having the colored replica image thereon and another transfer sheet to form another replica image having a different color on the image-receiving sheet; and (5) exposing the whole photopolymerizable thermal-adhesive layer to radiation to cure the photopolymerizable thermal-adhesive layer on the image receiving sheet.

Preferred embodiments of the process (B) of the invention are as follows:

1) The thermal-transfer recording process wherein the support has a thickness of 2 to 30 μm.

2) The thermal-transfer recording process wherein the substrate has a thickness of 50 to 1,000 μm.

3) The thermal-transfer recording process wherein the transfer materials are four kinds of materials which have colors (hues) of yellow, magenta, cyan and black different from one another.

4) The thermal-transfer recording process wherein before performing the step (5), the image-receiving sheet provided with two or more replica images having colors different from each other is placed on a receiving sheet in such a manner that the replica images and the receiving sheet come into contact with each other.

Furthermore, there is provided by the present invention a thermal-transfer recording process (C) comprising the steps of:

(1) placing a transfer material comprising a support film and an image forming layer provided thereon which contains a coloring material and an organic polymer on an image-receiving sheet comprising a substrate and a positive-type photosensitive thermal-adhesive layer in such a manner that the image forming layer and the photosensitive thermal-adhesive layer come into contact with each other, to form a composite;

(2) imagewise heating the surface of the support film side of the composite using a thermal head to increase a bonding strength between the image forming layer and the photosensitive thermal-adhesive layer in the heated portion;

(3) separating the transfer material from the image-receiving sheet leaving the image forming layer in the heated portion on the photosensitive thermal-adhesive layer to form a colored replica image on the image-receiving sheet;

(4) exposing the whole surface of the photosensitive thermal-adhesive layer on the substrate to ultraviolet rays via the colored replica image; and (5) treating the exposed layer with a developing solution to remove the exposed layer in the area having no colored replica image thereon.

Preferred embodiments of the process (C) of the invention are as follows:

1) The thermal-transfer recording process wherein the support film has a thickness of 2 to 50 μm.

2) The thermal-transfer recording process wherein the image forming layer has a thickness not more than 2.0 μm and has a transmittance density of not less than 0.9 to a light of wavelength region of 330 to 450 nm.

3) The thermal-transfer recording process wherein the positive-type photosensitive thermal-adhesive layer contains novolak-type phenol resin in the amount of 10 to 85 weight %.

4) The thermal-transfer recording process wherein the photosensitive thermal-adhesive layer contains an o-naphthoquinonediazide compound as a photosensitive material.

5) The thermal-transfer recording process wherein the organic polymer of the image forming layer is polyvinyl butyral.

In the thermal-transfer recording process of the invention, a sheet comprising the substrate such as plastic film or metal plate and the photopolymerizable or photosensitive thermal-adhesive layer thereon are employed as the image-receiving sheet (which will become a masking film, color proof or printing plate), and the thermal-adhesive layer contains a photopolymerizable or photosensitive monomer which serves as plasticizer. Since the thermal-adhesive layer is easily softened or fused by heating, the transfer layer in the heated area is easily transferred and strongly bonded to the thermal-adhesive layer. Hence, the obtained image shows high quality.

In the case (the process (A) or (B)) that the photopolymerizable thermal-adhesive layer is used as the thermal-adhesive layer (the image-receiving layer), after transfer of the image forming layer to the photopolymerizable thermal-adhesive layer, the thermal-adhesive layer is exposed to radiation to be cured so that the thermal-adhesive layer have a non-tacky surface. Further, the image forming layer formed on the thermal-adhesive layer also have a non-tacky surface because the photopolymerizable monomer contained in the thermal-adhesive layer enters into the image forming layer which is cured. Hence, the resultant image is scarcely peeled off or damaged (scratched) in using or handling the image-receiving sheet having the image.

Thus, the thermal-transfer recording process of the invention easily gives a color image having a high image quality and good durability as weel as a high sensitivity, or a masking film having a distinct image of high density. Further, the process can record an image having high image quality by means of thermal head according to digital signals.

In the case (the process (C)) that the positive-type photosensitive thermal-adhesive layer is used as the thermal-adhesive layer (the image-receiving layer), after transfer of the image forming layer to the photosensitive thermal-adhesive layer, the thermal-adhesive layer is exposed to radiation to decompose whereby the layer have a property soluble in an alkaline developing solution. After the development of the thermal-adhesive layer, a surface of the substrate having hydrophilic surface appears. In more detail, the image of the image forming layer is strongly bonded to the thermal-adhesive layer and the substrate having no image has not both the image forming layer and the thermal-adhesive layer to have a hydrophilic surface. Hence, the image-receiving sheet having the image is scarcely peeled off or damaged (scratched) in using or handling the image-receiving sheet having the image.

Thus, the thermal-transfer recording process simplifies a system for preparing a printing plate and reduce cost for the system. Further, the thermal-transfer recording process is advantageously employed for preparing a printing plate which is capable of recording high quality image using a digital signal, and has excellent printing characteristics and good durability in repetition of printing.

DETAILED DESCRIPTION OF THE INVENTION

The heat-intensively recording processes (A)–(C) according to the invention comprise as common steps the steps of placing the transfer material (comprising the thin support film and the image forming layer) on the image-receiving sheet (comprising the substrate and the photopolymerizable or photosensitive thermal-adhesive layer) in such a manner that the image forming layer and the thermal-adhesive layer come into contact with each other, to form a composite; imagewise heating the surface of the support film side of the composite; separating the transfer material from the image-receiving sheet leaving the image forming layer in the heated portion on the thermal-adhesive layer to form an image on the image-receiving layer; and exposing the whole surface of the thermal-adhesive layer to radiation.

First, the heat-intensively recording process (A) of the invention using the photopolymerizable thermal-adhesive layer as the thermal-adhesive layer (i.e., image receiving layer) of the image-receiving sheet is described in more detail by referring to the attached drawings.

Figure 1:
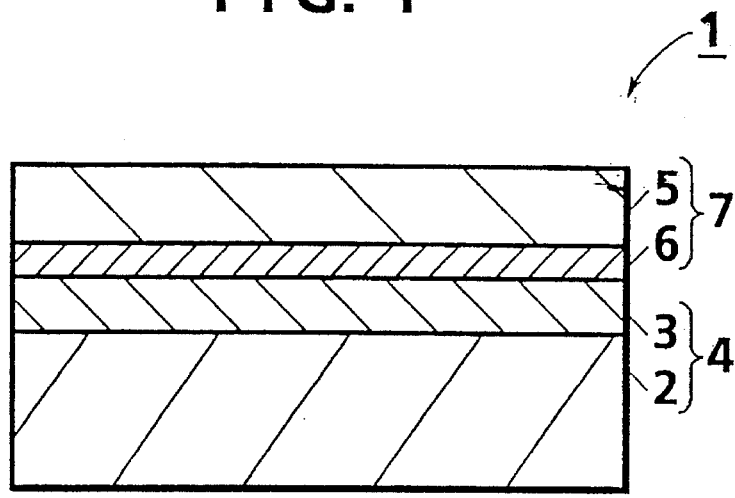
FIG. 1 is a sectional view of the representative example of the composite consisting of the transfer sheet and the image-receiving sheet which is advantageously utilized for the process of the invention.

A sectional view of the representative example of the composite consisting of the transfer sheet and the image-receiving sheet which is advantageously utilized for the process (A), is shown in FIG. 1.

In FIG. 1, a photopolymerizable thermal-adhesive layer 3 is arranged on a substrate 2 to constitute a image-receiving sheet 4 and an image forming layer 6 is formed on a support film 5 to constitute a transfer material 7. The transfer material 7 is placed on the image-receiving sheet 4 in such a manner that the image forming layer 6 and the photopolymerizable thermal-adhesive layer 3 come into contact with each other.

The substrate 2 of the image-receiving sheet 4 has a thickness of 50 to 1,000 nm and preferably 75 to 300 nm, in order to improve workability in performing the process and handling of the sheet produced by forming an image thereon.

Examples of the support film 2 include papers; papers laminated with plastics such as polyethylene and polypropylene; polyester films such as polyethylene terephthalate (PET) film; and polycarbonate films.

The photopolymerizable thermal-adhesive layer 3 of the image-receiving sheet 4 has a property capable of strongly bonding to the image forming layer by heat energy given by thermal head in the step (2) described above, i.e., the next step, (a bonding strength between the thermal-adhesive layer and the image forming layer is more than that between the support film and the image forming layer as described later), and has a curing property which is cured through change of rheology and heat behavior by exposure to radiation (in the step (4)) to give a film strength to sufficiently endure handling and working.

The photopolymerizable thermal-adhesive layer 3 generally comprises the following materials:

(a) at least one multi-functional vinyl or vinylidene compound capable of forming a polymer by photopolymerization (addition polymerization);

(b) an organic polymer binder;

(c) photopolymerization initiator activated by radiation (e.g., light, particularly ultra-violet (UV) rays, generated by mercury lamp, xenon lamp or laser source); and (d) thermalpolymerization inhibitor, if desired.

Examples of the multi-functional vinyl or vinylidene compound as described above (a) include unsaturated ester of polyol (preferably acrylates or methacrylates of the polyols) such as ethylene glycol diacrylate, glycerol triacrylate, ethylene glycol dimethacrylate, 1,3-propanediol dimethacrylate, polyethylene glycol dimethacrylate, 1,2,4-butanetriol trimethacrylate, trimethylol ethane triacrylate, pentaerythritol dimethacrylate, pentaerythritol trimethacrylate, pentaerythritol tetramethacrylate, pentaerythritol diacrylate, pentaerythritol triacrylate, pentaerythritol tetraacrylate, dipentaerythritol polyacrylate, 1,3-propanediol diacrylate, 1,5-pentanediol dimethacrylate, bisacrylate or bismethacrylate of polyethylene glycol having molecular weight of 200 to 400 and the compounds analogous to these compounds.

As the above compounds, unsaturated amides can be also employed. Examples of the amides preferably include unsaturated amides of acrylic acid or methacrylic acid having α,ω-diamines such as ethylene bismethacrylamide and ethylene bisacrylamide. The alkylene chain of the amides may be interrupted by an oxygen atom.

The above monomers may be used either alone or as a mixture of two or more kinds. The monomers are not restricted to the above compounds.

The organic polymer binder as described above (b) generally is a thermoplastic polymer to obtain a good image transfer property. Preferably, the organic polymer binder is a polymer of vinyl compound from the viewpoint of compatibility with the vinyl or vinylidene compound and the photopolymerization initiator. Examples of the organic polymer binders preferably include polyvinyl chloride, polyacrylic acid, polymethyl acrylate, polyethyl acrylate, polybutyl acrylate, polymethacrylic acid, polymethyl methacrylate, polyvinyl ether, polyvinyl acetal, and copolymer of at least two monomers selected from the group consisting of vinyl chloride, acrylic acid, methyl acrylate, ethyl acrylate, butyl acrylate, methacrylic acid, methyl methacrylate and vinyl ether.

The photopolymerization initiator as described above (c) generally is a initiator showing small absorption within a visible region to render handling in daylight room easy. The initiator preferably is a compound showing photosensitivity in a wavelength region of not more than 450 nm. Examples of the initiators preferably include aromatic ketones such as benzophenone, Michler's ketone (4,4'-bis(dimethylamino)benzophenone), 4,4'-bis(diethylamino)benzophenone, 4-methoxy-4'-dimethylaminobenzophenone, 2-ethylanthraquinone, phenanthraquinone, and other aromatic ketones; benzoyl; benzoin ethers such as benzoin methyl ether, benzoin ethyl ether and benzoin phenyl ether; benzoins such as methylbenzoin and ethylbenzoin; and 2,4,5-triarylimidazole dimers such as 2-(o-chlorophenyl)-4,5- diphenylimidazole dimer, 2-(o-chlorophenyl)-4,5-di(m-methoxyphenyl)imidazole dimer, 2-(o-fluorophenyl)-4,5-diphenylimidazole dimer, 2-(o-methoxyphenyl)-4,5-diphenylimidazole dimer, 2-(p-methoxyphynyl)-4,5-diphenylimidazole dimer, 2,4-di(p-dimethoxyphenyl)-5-phenylimidazole dimer, 2-(2,4-dimethoxyphenyl)-4,5-diphenylimidazole dimer, 2-(p-methylmercaptophenyl)-4,5-diphenylimidazole dimer and dimers described in U.S. Pat. Nos. 3,479,185 and 3,784,557 and British Patent No. 1,047,569. Further, preferred also is a photopolymerization initiator comprising a complex of a cationic compound and an anionic compound of borate described in U.S. Pat. No. 4,772,541, which undergoes decoloration or disappearance of absorption spector by exposure.

In the case that the image finally obtained by the process of the invention is used as a masking film for a printing plate, light transmittance of the non-image portion of the image (masking film) is preferred to be high. To satisfy the transmittance, a transmittance density of the non-image area after the step (4), i.e., procedure exposing the photopolymerizable thermal-adhesive layer to light, preferably is not more than 0.5 in the wavelength region of 350 to 450 nm, and therefore the photopolymerization initiator (c) is employed by appropriately selecting its kind and content so as to satisfy the transmittance density.

The ratios of contents between the above ingredients (a), (b) and (c) which are contained in the photopolymerization heat-adhesive layer 3 preferably are as follows. The ratio of the ingredients (a) and (b) preferably is 0.1:1.0 to 2.0:1.0 by weight ((a): (b)), and the content of the ingredient (c) preferably is in the range of 0.002 to 20 weight % and more preferably in the range of 0.01 to 10 weight % based on the content of the ingredient (a).

Examples of the thermal polymerization inhibitor (the above ingredient (d), which is contained in the photopolymerizable thermal-adhesive layer if desired, include hydroquinone, p-methoxyphenol, alkyl or aryl-substituted hydroquinone, t-butylcatechol, pyrogallol, naphthylamine, D-naphthol, phenothiazine, pyridine, nitrobenzene, o-toluquinone, and arylphosphite.

The photopolymerizable thermal-adhesive layer 3 can be formed on the substrate 2 according to a known method. In more detail, the multi-functional vinyl or vinylidene compound, the organic polymer binder, the photopolymerization initiator and the thermalpolymerization inhibitor if desired are dissolved in an organic solvent or a mixture thereof to prepare a coating solution. The solution is coated on the substrate by a coating method such as a rotatable coating method (e.g., whirler coating, spinner coating), a web coating method (e.g., gravure coating, doctor blade coating, wire bar coating), or a dipping method and then dried to form the photopolymerizable thermal-adhesive layer. The photopolymerizable thermal-adhesive layer preferably has a thickness of 0.5 to 100 μm.

The photopolymerizable thermal-adhesive layer 3 plays a role in selectively receiving only the image forming layer in the heated area and is free from the problems that the transfer layer in the heated area is not evenly in contact with the uneven surface of the receiving sheet or is scarcely transferred onto the surface on which foreign matters are stuck. Such problems are found in the conventional heat-transfer recording material of heat-sensitive fusion type. Further, the photopolymerizable thermal-adhesive layer 3 generally plays a role that the image forming layer formed on the thermal-adhesive layer 3 is further transferred onto another receiving sheet after completion of the process (A).

The photopolymerizable thermal-adhesive layer 3 may be directly formed on the substrate 2 or may be formed via a subbing layer (not shown in Figure) provided on the substrate. The provision of the subbing layer brings about: (1) increase of bonding strength between the photopolymerizable thermal-adhesive layer 3 and the substrate 2; (2) improvement of transferring property due to elastic effect of the subbing layer when the image forming layer 6 is transferred onto the photopolymerizable thermal-adhesive layer 3 in the heated area of the transfer material, i.e., excellently even contact with an uneven surface: and (3) improvement of peeling property between the photopolymerizable thermal-adhesive layer 3 and the substrate 2 when the final image obtained by the process of the invention is further transferred to another receiving sheet.

In the above (2), the subbing layer facilitates of deformation of the photopolymerizable thermal-adhesive layer 3 to decrease difference of thickness between the image forming layers depending on overlapping of the image forming layers in the case that two or more kinds of transfer layers are particularly transferred onto the same image-receiving sheet in layers, and the subbing layer maintains evenness of the photopolymerizable thermal-adhesive layer 3 by incorporating foreign matters into the subbing layer and the photopolymerizable thermal-adhesive layer to improve the transferring property in the case that the foreign matters are stuck to the image forming layer or the photopolymerizable thermal-adhesive layer in the step (1).

To obtain the above effects, the subbing layer preferably has a glass tradition temperature of not lower than room temperature, and the total thickness of the photopolymerizable thermal-adhesive layer and the subbing layer preferably is 5 to 100 μm.

As the support film 5 of the transfer material 7 of the invention, various polymers capable of forming a film are employable. Examples of such polymers include polyester such as polyethylene terephthalate (PET), polycarbonate, polystyrene, cellulose triacetate, polyolefin such as polyethylene and polypropylene, polyimide, polyvinyl chloride, polyvinylidene chloride polystyrene and styrene/acrylonitrile copolymer. The support is so thin that its mechanical strength preferably is increased by biaxially stretched orientation. Further, the support preferably has heat resistance so as to endure heating condition in the heat-sensitively transferring procedure (the step (2)).

The thickness of the support generally is in the range of 2 to 30 μm, and preferably in the range of 2 to 10 μm. If the thickness is more than 30 μm, the heat energy which is conducted from the thermal head to the photopolymerizable thermal-adhesive layer 3 is small not to sufficiently increase the bonding strength between the image forming layer 6 and the photopolymerizable thermal-adhesive layer 3. If the thickness is less than 2 μm, the film strength of the support decreases to make it difficult to maintain the shape of the transfer material 7, to handle it and to superpose it on the image-receiving sheet.

The known back layer such as a fusion-preventing layer may be provided on the surface opposite to the image forming layer side of the support film 5 so as not to bring in contact with the thermal head. Further, the surface of the image forming layer side of the support 5 may be subjected to various treatments to adjust adhesion property between the support and the image forming layer. Examples of the treatments include the formation of a subbing layer comprising various resin, surface lubricants such as fluoro compounds and silicon compounds and adhesion-increasing agents such as silan-coupling agents on the support, or physical treatment of the surface of the support such as glow discharge and corona charge.

The image forming layer 6 contains a coloring material and an organic polymer binder. The coloring material contained in the image forming layer 6 includes various pigments or dyes. Preferred examples of the pigments include black pigments such as carbon black; and colored pigments such as an azo type, a thioindigo type, a durene type (e.g., anthraquinones), a dioxadine type (e.g., triphenyldioxadines), a phthalocyanine type, a quinacridone type and an isoindolenone type. In addition to the pigments, metal powders and fluorescent pigments can be also employed if desired. Further, preferred examples of the dyes include acid dyes, direct dyes, disperse dyes and oil-soluble dyes. In the case of preparing the masking film, it is preferred to employ carbon black as a coloring material. The coloring material preferably contains pigments having a particle size of not more than 1.0 µm in the amount of 70 weight %.

The organic polymer binder contained in the image forming layer 6 includes various organic polymers. Examples of the organic polymers preferably include polyvinyl butyral, copolymer of styrene/maleic acid or half ester thereof, poly(meth)acrylic acid ester, copolymer containing (meth)acrylid acid ester as ingredient thereof, cellulose derivatives (e.g., cellulose and cellulose triacetate), polyolefin (e.g., polyethylene and polypropylene), chlorinated polyolefine, copolymer containing vinyl acetate as ingredient thereof (e.g., ethylene/vinyl acetate copolymer), polyamide and polyester.

The organic polymer binder more preferably is polyvinyl butyral, because use of polyvinyl butyral brings about an appropriate bonding strength between the image forming layer 6 and the support 5 and good thermal-adhesion strength between the image forming layer 6 and the photopolymerizable thermal-adhesive layer 3.

The polyvinyl butyral preferably has a number-average molecular weight of 200 to 800 and a butyral value of 50 to 85 weight %. If the polyvinyl butyral having a number-average molecular weight of less than 200 is employed for the image forming layer, film strength (resistance to scuffing) of the image forming layer is reduced and the image quality also reduced. If the polyvinyl butyral having a number-average molecular weight of more than 800 is employed for the image forming layer, resolution and dot reproduction of the resultant image are not sufficiently satisfied. Further, if the polyvinyl butyral having a butyral value of less than 50 weight % is employed for the image forming layer, resolution and dot reproduction of the resultant image are not sufficiently satisfied and its shelf life is decreased. If the polyvinyl butyral having a butyral value of more than 80 weight % is employed for the image forming layer, the image quality is reduced and cost of the material is increased.

The organic polymer binder generally contains polyvinyl butyral in the amount of not less than 50 weight %, preferably in the amount of not less than 70 weight % and more preferably in the amount of 85 weight %.

The mixed ratio between the coloring material and the organic polymer binder preferably is in the range of 10:2 to 10:30 by weight, although the ratio varies depending upon kinds of the coloring material and the organic polymer binder employed and the desired transmittance density of the image forming layer.

The image forming layer 6 may contains plasticizers if desired. Plasticizers enployabel for the image forming layer are appropriately selected depending upon kinds of the coloring material and the organic polymer binder employed. Examples of the platicizers preferably include phthalic acid esters such as dibutyl phthalate (DBP), di-noctyl phthalate (DnOP), di(2-ethylhexyl) phthalate (DOP), dinonyl phthalate (DNP), dilauryl phthalate (DLP), butyl lauryl phthalate (BLP) and butyl benzyl phthalate (BBP); aliphatic dibasic acid esters such as di(2-ethylhexyl) adipate (DOA) and di(2-ethylhexyl) sebacate (DOS); phosphoric acid triesters such as tricresyl phosphate (TCP) and tri(2-ethylhexyl) phosphate (TOP); polyol esters such as polyethylene glycol esters; and epoxy compounds such as epoxy fatty acid esters.

In addition to the above plasticizers, (meth)acrylic acid esters such as polyethylene glycol dimethacrylate, 1,2,4-butantriol trimethacrylate, trimethylolethan triacrylate, pentaerithritol triacrylate, pentaerithritol tetraacrylate and pentaerithritol polyacrylate are preferably employed as plasticizer depending upon the kind of the binder. These plasticizers may be employed singly or in combination. Further, the plasticizers may contain secondary plasticizers (auxiliary plasticizers) such as polychlorinated paraffin.

The plasticizers are generally contained in the image forming layer in the amount satisfying the following relation. The ratio between the total amount of the coloring material and binder and the amount of the plasticizer preferably is in the range of 100:1 to 100:200 (the total amount: the plasticizer) by weight, and more preferably 100:2 to 100:100.

The image forming layer may further contain surface active agents, thickening agents, dispersing agents, adhesion promoting agents and the other additives.

The image forming layer 6 of the transfer material 7 is transferred onto the surface of the photopolymerizable thermal-adhesive layer to serve as an image on the thermal-adhesive layer. The image forming layer 6 may be a layer that does not contain a heat-fusion material such as wax, the wax being contained in the conventional transfer layer. In this case, the amount of the coloring material contained in the image forming layer can be increased compared with that in the conventional transfer layer, so that the thickness of the image forming layer can be extremely reduced in the case that the density of the image obtained by the process of the invention is the same level as that by the conventional process.

The thickness of the image forming layer varies depending upon utilization form and optical density needed in the finally obtained image and upon kind and content of the coloring material, so that it can not be in common defined in all cases.

In the case of utilizing the reflection density of the final image formed on the photopolymerizable thermal-adhesive layer (e.g., seeing the final image itself), the density comes in the region to be sufficiently satisfied by setting the thickness of the image forming layer in the range of 0.05 to 1.0 µm (the conventional heat-fusion transfer layer is generally required to the thickness of 3 to 4 µm). In the case of utilizing the transmittance density of the image (e.g., preparing the masking film), the transmittance density of an image area of the image to light in the wavelength region of 350 to 450 nm should be set to 2.5 (value of desirable transmittance density), which is obtained by arranging the thickness of the image forming layer in the range of 0.3 to 2 µm. Such thin transfer layer brings about the finally formed image having an excellent sharpness and resolution.

The image forming layer 6 can be formed on the support according to a known method. In more detail, the coloring material, the organic polymer binder, and the plasticizer and the other additives if desired are ground in a mill until the particle size of the coloring material becomes the desired size. The obtained paste is dissolved in an organic solvent or a mixture thereof to prepare a coating dispersion. The dispersion is coated on the support in the above manner and then dried to form the image forming layer.

On the surface opposite to the support 5 side of the image forming layer 6 of the transfer material 7, a cover film may be provided to prevent occurrence of scratch (mark) on the support in handling or adhesion between the films (transfer materials), if desired. Examples of materials of the cover film preferably include polyethylene terephthalate, polycarbonate, polyethylene, polypropylene, polyvinyl chloride, polyvinylidene chloride, polystyrene and styrene/acrylonitrile copolymer. Particularly preferred are polyethylene, polypropylene and polyethylene terephthalate.

In the step (1), the transfer material 4 is placed on the image-receiving sheet 7 in such a manner that the image forming layer 6 and the photopolymerizable thermal-adhesive layer 3 come into face-to-face contact with each other, to form a composite 1. In this case, the bonding strength between the image forming layer 6 and the photopolymerizable thermal-adhesive layer 3 is required to be less than that between the substrate 2 and the photopolymerizable thermal-adhesive layer 3 and that between the image forming layer 6 and the support film 5. The composite 1 is generally formed at a temperature of room temperature to 130° C. The formation (lamination) of the composite may be conducted with hands or by using a laminator under pressure. In the case of using the laminator, the pressure is preferably set to not more than 8 kg/cm².

Figure 2:
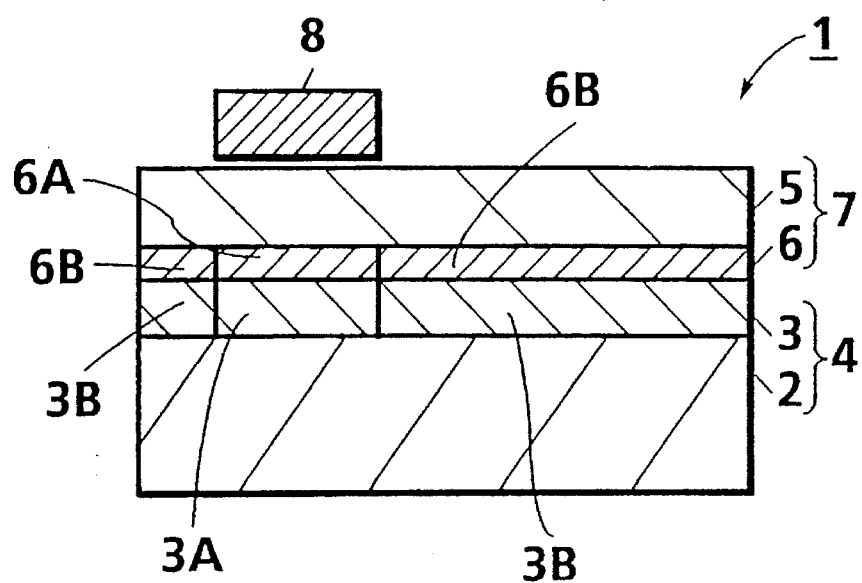
FIG. 2 is a schematic view showing a condition wherein the composite of FIG. 1 is imagewise heated to record an image.

Subsequently, the step (2) of the process (A) according to the invention is explained referring to FIG. 2 which shows a sectional view of the representative example of the step (2). FIG. 2 shows a condition wherein the composite of FIG. 1 is imagewise heated by placing the thermal head 8 over the support 5 to record an image. The recording process of the step (2) is performed according to a known thermal-transfer recording process, i.e., the transfer material 7 of the composite is heated by use of the thermal head (exothermic element) 8 according to digital image signals which is inputted to the thermal head, and thus letter or pattern is recorded in the composite.

In FIG. 2, the heat of the thermal head 8 is conducted to the photopolymerizable thermal-adhesive layer 3 in the heated area 3A via the image forming layer 6 in the heated area 6A, and raises a temperature of the photopolymerizable thermal-adhesive layer 3 in the heated area 3A to bond the image forming layer 6 in the heated area 6A to the photopolymerizable thermal-adhesive layer 3 in the heated area 3A. The bonding of the image forming layer 6 in the heated area 6A to the photopolymerizable thermal-adhesive layer 3 in the heated area 3A is conducted utilizing the thermal-adhesion function of the photopolymerizable thermal-adhesive layer 3 (originated from that the photopolymerizable thermal-adhesive layer 3 contains a photopolymerizable monomer), so that the image forming layer 6 is not required to contain a heat-fusion material which is generally contained in the image forming layer in the conventional process. Further, since the image forming layer 6 does not contain the heat-fusion material, the thickness of the image forming layer 6 can be made thin. Hence, the heat from the thermal head 8 is fast and efficiently conducted to the photopolymerizable thermal-adhesive layer 3.

The bonding strength between the image forming layer 6 in the heated area 6A and the photopolymerizable thermal-adhesive layer 3 in the heated area 3A after heating by the thermal head is increased as compared with that between the image forming layer 6 in the unheated area 6B and the photopolymerizable thermal-adhesive layer 3 in the unheated area 3B which is the same as that of the composite before heating. In addition, the bonding strength between the image forming layer 6 in the heated area 6A and the photopolymerizable thermal-adhesive layer 3 in the heated area 3A is required to be greater than that between the image forming layer 6 and the support 5. In more detail, in the preparation of the transfer material 7, the material and composition of each of the support film 5 and the image forming layer 6 are required to be selected in a such a manner that the bonding strength between the image forming layer 6 in the heated area 6A and the photopolymerizable thermal-adhesive layer 3 in the heated area 3A after the step (2) (heating by the thermal head) and the bonding strength between the image forming layer 6 and the support film 5 have the relationship as mentioned above.

Figure 3:
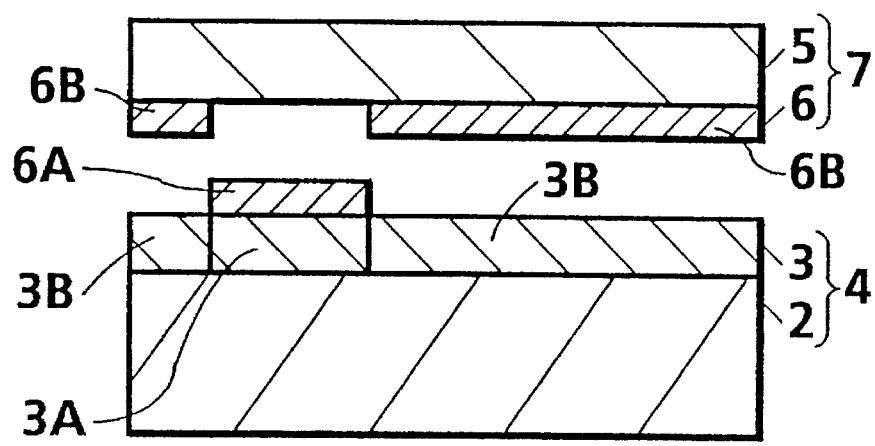
FIG. 3 is a schematic view showing a condition wherein the transfer material is peeled from the image-receiving sheet.

The step (3) of the process (A) according to the invention is explained referring to FIG. 3 which shows a sectional view of the representative example of the step (3). FIG. 3 shows a condition wherein the transfer material 7 is separated from the image-receiving sheet 4. In FIG. 3, the bonding strength between the image forming layer 6 in the heated area 6A and the photopolymerizable thermal-adhesive layer 3 in the heated area 3A is increased as compared with that between the image forming layer 6 in the unheated area 6B and the photopolymerizable thermal-adhesive layer 3 in the unheated area 3B, so that the image forming layer 6 in the heated area 6A is left on the photopolymerizable thermal-adhesive layer 3 and the image forming layer 6 in the unheated area 6B is separated from the photopolymerizable thermal-adhesive layer 3 together with the support film 5. As a result, on the surface of the photopolymerizable thermal-adhesive layer 3 of the image-receiving sheet 4, a colored replica image consisting of the heated area 6A of the image forming layer 6 which corresponds to the image recorded in the step (2) is formed.

Figure 4:
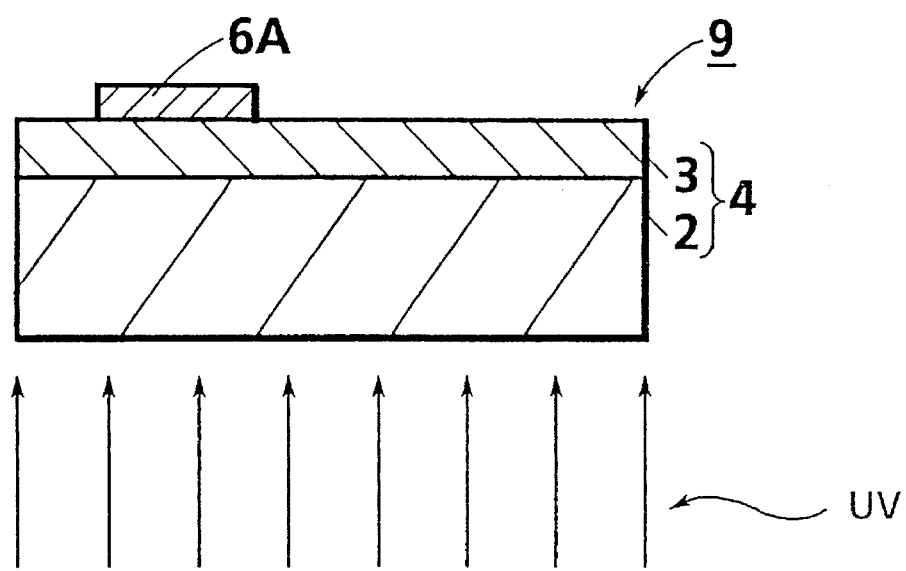
FIG. 4 is a schematic view showing a condition wherein the photopolymerizable thermal-adhesive layer is exposed to radiation.

The step (4) of the process (A) according to the invention is explained referring to FIG. 4 which shows a sectional view of the representative example of the step (4). FIG. 4 shows a condition wherein the photopolymerizable thermal-adhesive layer 3 is exposed to radiation. In more detail, the surface of the substrate 2 side of the photopolymerizable thermal-adhesive layer 3 (of the image-receiving sheet) is exposed to radiation (UV-rays), which results in cure of the photopolymerizable thermal-adhesive layer 3. Thus, the final image recorded product 9 which consists of the substrate 2, the cured photopolymerizable thermal-adhesive layer 3 provided thereon and the image forming layer 6 in the heated area 6A formed on the thermal-adhesive layer 3 is prepared. In the exposing procedure, the surface of the photopolymerizable thermal-adhesive layer 3 (of the image-receiving sheet) may be exposed to radiation.

The above final image recorded product prepared by the process (A) of the invention, i.e., the product having the image of the image forming layer formed on the image-receiving sheet, can be employed as a proof, a masking film, a phototypesetting manuscript and a manuscript for OHP (overhead projector).

In the case of using the final product 9 as a masking film, the cured photopolymerizable thermal-adhesive layer 3 in the unheated area (unprinted area) preferably has a transmittance density of not more than 0.5 to a light in the wavelength region of 350 to 450 nm and the substrate 2 of the image-receiving sheet 4 preferably is a essentially transparent substrate. Further, the image forming layer 6 corresponding to the image portion of the masking film preferably has a thickness of 0.3 to 2.0 μm and a transmittance density of not less than 2.0 to a light in the wavelength region of 350 to 450 nm. To form such transfer layer 6, it is preferred that the coloring material contained in the image forming layer 6 preferably contains a pigment (preferably carbon black) having a particle size of not more than 1.0 μm in the amount of 70 weight %.

In the case of using the final image recorded product 9 as a product such as a proof that itself is seen or as an intermediate product that is employed for transferring an image onto a receiving sheet, the transmittance density of the cured photopolymerizable thermal-adhesive layer 3 is not particularly restricted and further the substrate 2 of the image receiving sheet 4 is not restricted to a transparent substrate.

Otherwise, before performing the step (4), the following step may be carried out. The image receiving sheet 4 having the image formed in the step (3) is placed on the appropriate receiving sheet (e.g., coated paper) in such a manner that the photopolymerizable thermal-adhesive layer 3 and the receiving sheet come into in contact with each other. Subsequently, the surface of the substrate 2 side of the image receiving sheet 4 is exposed to radiation (e.g., UV rays) and then the substrate 2 is peeled to transfer the photopolymerizable thermal-adhesive layer 3 and the image 6A (the image forming layer 6 in the heated area 6A) onto the receiving sheet.

Subsequently, the thermal-transfer recording process (B) of the invention is described in more detail by referring to the attached drawings.

In the process (B), first at least two transfer materials each of which is the same as one employed in the process (A) are prepared. The transfer materials have transfer layers which have hues different from each other. The hue of the image forming layer can be changed by variation of kind and/or content of the coloring material contained in the image forming layer (and by variation of combination of the coloring materials if using them in two or more kind).

In the case of preparing a final image recorded product having a color image according to the process (B), the transfer materials which have hues of yellow (Y), magenta (M), cyan (C) and black (B) are prepared. Hence, as materials of the transfer material, the same materials as those employed in the process (A) can be employed. The process (B), however, employs two or more transfer layer having different hues from each other as mentioned above.

Further, the image receiving sheet employed in the process (B) is the same as one in the process (A).

To explain the process (B), the process wherein a final image recorded product having a color image is prepared using the transfer materials having hues of yellow (Y), magenta (M), cyan (C) and black (B) is described.

In the step (1), each of four kinds of transfer materials is placed on the image-receiving sheet in such a manner that the image forming layer and the photopolymerizable thermal-adhesive layer come into face-to-face contact with each other to form a composite, in the same manner as the step (1) of the process (A) (see FIG. 1).

In the step (2), the surface of the support film of the composite is imagewise heated by placing the thermal head 8 over the support film to increase a bonding strength between the image forming layer in the heated area and the photopolymerizable thermal-adhesive layer (see FIG. 2). The imagewise heating is performed to give an image of black component of the color original image. The relation of the bonding strengths among the support film, the image forming layer and the photopolymerizable thermal-adhesive layer is the same as that described in the step (2) of the process (A).

In the step (3), the above transfer material (black) having black hue is separated from the image-receiving sheet in the same manner as the step (3) of the process (A). In the separating procedure, the bonding strength between the image forming layer in the heated area and the photopolymerizable thermal-adhesive layer in the heated area is increased as compared with that between the image forming layer in the unheated area and the photopolymerizable thermal-adhesive layer in the unheated area. The image forming layer in the heated area, therefore, is left on the surface of the photopolymerizable thermal-adhesive layer and the image forming layer in the unheated area is separated from the surface of the polymerizable thermal-adhesive layer together with the support film. As a result, a black replica image of the image forming layer in the heated area which corresponds to the image recorded in the above step is formed on the surface of the photopolymerizable thermal-adhesive layer of the image-receiving sheet.

Figure 5:
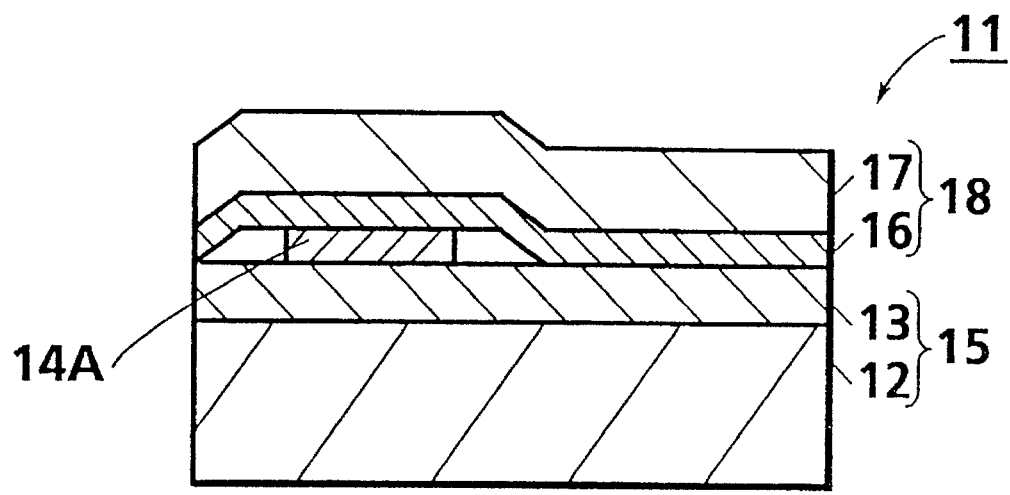
FIG. 5 is a sectional view showing a condition wherein a transfer material having cyan hue is placed on the image-receiving sheet having a black image.

Subsequently, the step (4-1) of the process (B) is explained referring to FIG. 5 which shows a sectional view of the representative example of the step (4-1). FIG. 5 shows a condition wherein a transfer material having cyan hue is placed on the image-receiving sheet having a black replica image. In more detail, on the image-receiving sheet 15 in which the image forming layer in the heated area 14A (black replica image) corresponding to the image recorded in the above step is formed on the surface of the photopolymerizable thermal-adhesive layer 13 provided on the substrate 12, the transfer material (cyan) having an image forming layer 16 provided on a support film 17 is placed, in such a manner that the image forming layer 16 and the photopolymerizable thermal-adhesive layer 13 come into face-to-face contact with each other to form a composite 11, in the same manner as the step (1).

Figure 6:
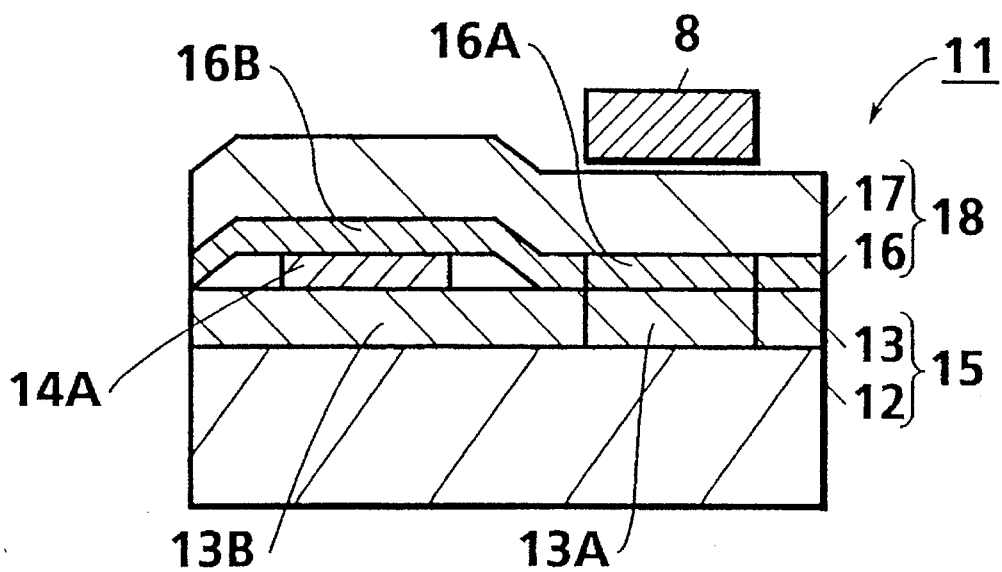
FIG. 6 is a sectional view showing a condition wherein the composite of FIG. 5 is imagewise heated by use of thermal head to record an image.

The step (4-2) of the process (B) is explained referring to FIG. 6 which shows a sectional view of the representative example of the step (4-2). FIG. 6 shows a condition wherein the composite of FIG. 5 is imagewise heated by means of thermal head to record an image. In more detail, the composite 11 obtained in the step (4-1) is imagewise heated by placing the thermal head 8 over the support film 17 to increase a bonding strength between the image forming layer 16 in the heated area 16A and the photopolymerizable thermal-adhesive layer 13. The imagewise heating is performed to give an image of cyan component of the color original image.

In FIG. 6, the heat of the thermal head 8 is conducted to the photopolymerizable thermal-adhesive layer 13 in the heated area 13A via the image forming layer 16 in the heated area 16A, and raises a temperature of the photopolymerizable thermal-adhesive layer 13 in the heated area 13A to bond the image forming layer 16 in the heated area 16A to the photopolymerizable thermal-adhesive layer 13 in the heated area 13A by heating. The bonding strength of the image forming layer 16 in the heated area 16A and the photopolymerizable thermal-adhesive layer 13 in the heated area 13A (after heating by the thermal head) is increased as compared with that between the image forming layer 16 in the unheated area 16B and the photopolymerizable thermal-adhesive layer 13 in the unheated area 13B which is the same as that of the composite before heating. In addition, the bonding strength between the image forming layer 16 in the heated area 16A and the photopolymerizable thermal-adhesive layer 13 in the heated area 13A is required to be greater than that between the image forming layer 16 in the unheated area 16B and a black image area 14A, and that between the image forming layer 16 and the support film 17.

Figure 7:
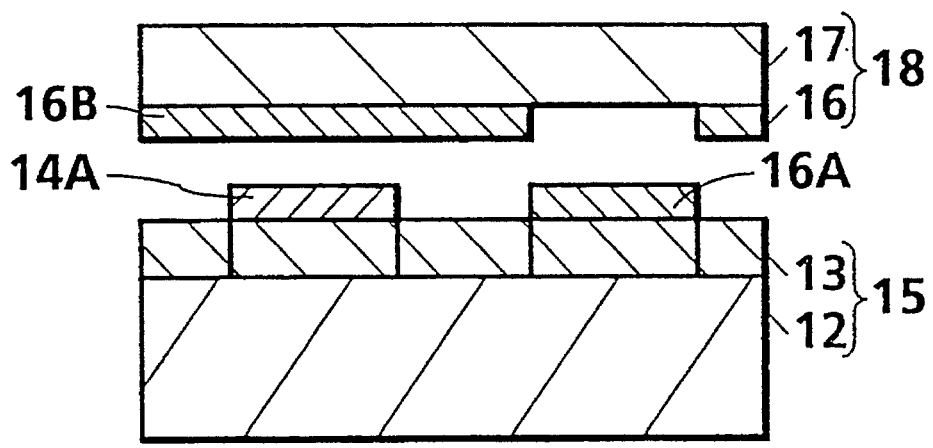
FIG. 7 is a schematic view showing a condition wherein the transfer material is peeled from the image-receiving sheet.

The step (4-3) of the process (B) is explained referring to FIG. 7 which shows a sectional view of the representative example of the step (4-3). FIG. 7 shows a condition wherein the transfer material (cyan) 18 is peeled from the image-receiving sheet 15.

In the step (4-3), the bonding strength between the image forming layer 16 in the heated area 16A and the photopolymerizable thermal-adhesive layer 13 in the heated area 13A is increased as compared with that between the image forming layer 16 in the unheated area 16B and the photopolymerizable thermal-adhesive layer 13 in the unheated area 13B. The image forming layer 16 in the heated area 16A, therefore, is left on the surface of the photopolymerizable thermal-adhesive layer 13 and the image forming layer 16 in the unheated area 16B is separated from the surface of the polymerizable thermal-adhesive layer 13 together with the support film. As a result, a cyan replica image of the image forming layer 16 in the heated area 16A which corresponds to the image recorded in the step (4-2) is formed on the surface of the photopolymerizable thermal-adhesive layer 13 of the image-receiving sheet 15. Hence, on the surface of the photopolymerizable thermal-adhesive layer 13 of the image-receiving sheet 15, both of the black image formed in the step (3) and the cyan image formed in the step (4-3) is provided.

As apparent from the above explanation, the steps (4-1), (4-2) and (4-3) of the process (B) are performed similarly to the steps (1), (2) and (3) of the process (B).

Subsequently, a transfer material (magenta) provided with an image forming layer of hue of magenta and the image-receiving sheet prepared in the step (4-3) are subjected to the same procedures as those of the steps (4-1), (4-2) and (4-3). As a result, the image-receiving sheet on which the black image, the cyan image and the magenta image are formed is prepared. Further, a transfer material (yellow) provided with an image forming layer of hue of yellow and the above image-receiving sheet are subjected to procedures the same procedures as those of the steps (4-1), (4-2) and (4-3), whereby the image-receiving sheet on which the black image, the cyan image, the magenta image and the yellow image are formed is prepared. The steps for preparing the magenta image and the yellow image will be easily understood with no showing figure.

Figure 8:
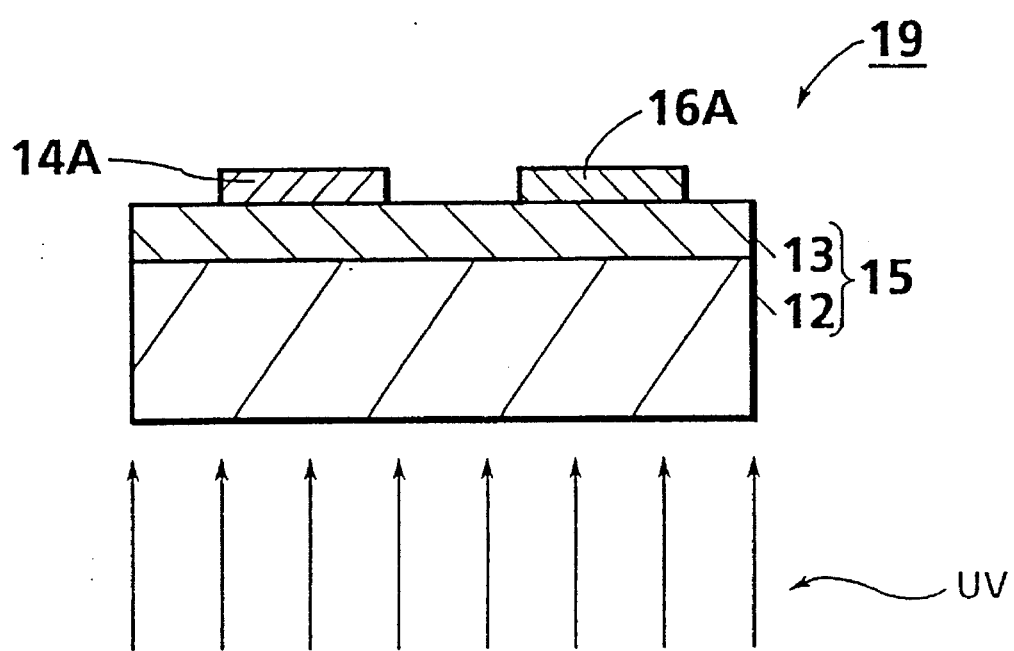
FIG. 8 is a schematic view showing a condition wherein the photopolymerizable thermal-adhesive layer of the image-receiving sheet having two colors is exposed to radiation.

In the final step (5) of the process (B), the final step of the process (B) is explained referring to FIG. 8 which shows a sectional view of the representative example of the final step. FIG. 8 shows a condition wherein the photopolymerizable thermal-adhesive layer of the image-receiving sheet having two colors (a magenta image and a yellow image are omitted) is exposed to radiation. In more detail, the surface of the substrate 12 side of the photopolymerizable thermal-adhesive layer 13 (of the image-receiving sheet) is exposed to radiation (UV-rays), which results in cure of the photopolymerizable thermal-adhesive layer 13. Thus, the final image recorded product 19 which consists of the substrate 12, the cured photopolymerizable thermal-adhesive layer 13 provided thereon and the image forming layers in the heated areas (transfer layers having hues different from each other) formed on the thermal-adhesive layer 13 is prepared. In the exposing procedure, the surface of the photopolymerizable thermal-adhesive layer 13 (of the image-receiving sheet) may be exposed to radiation.

In the exposing procedure after the step (4-1), the area heated by the thermal head may overlap with the image area having already formed in the prior step.

The process (B) of the invention is restricted to the process using transfer materials having four hues, and can be performed using transfer materials having two or more hues different from each other in the same manner. The final image recorded product, for example, can be directly used for a color proof.

In stead of performance of the final step (5), the following procedures may be performed. The image-receiving sheet 15 on which the image forming layers having at least two hues different from each other are formed is placed on an appropriate receiving sheet (e.g., coated paper) in such a manner that the photopolymerizable thermal-adhesive layer 13 and the receiving sheet come into contact with each other. Subsequently, the surface of the substrate 12 side of the image-receiving sheet 15 is exposed to radiation (e.g., UV-rays), and then the substrate 12 is peeled to transfer the cured photopolymerizable thermal-adhesive layer 13 and the images 14A and 16A onto the receiving sheet.

Subsequently, the thermal-transfer recording process (C) of the invention using the positive-type photosensitive thermal-adhesive layer as the thermal-adhesive layer of the image-receiving sheet is described in more detail by referring to the attached drawings.

Figure 9:
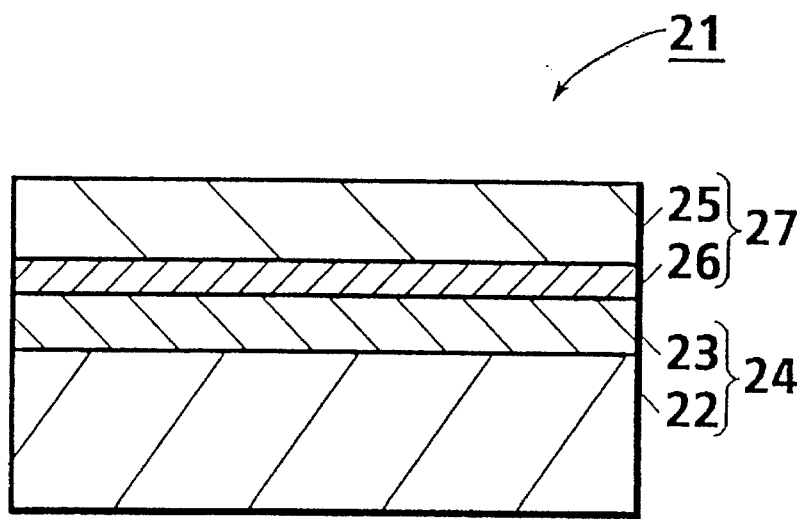
FIG. 9 is a schematic view showing the representative example of the composite consisting of the transfer sheet and the image-receiving sheet which is advantageously utilized for the process (C).

A sectional view of the representative example of the composite consisting of the transfer sheet and the image-receiving sheet which is advantageously utilized for the process (C), is shown in FIG. 9.

In FIG. 9, a positive-type photosensitive thermal-adhesive layer 23 is arranged on a substrate 22 to constitute a image-receiving sheet 24 and an image forming layer 26 is formed on a support film 25 to constitute a transfer material 27. The transfer material 27 is placed on the image-receiving sheet 24 in such a manner that the image forming layer 26 and the thermal-adhesive layer 23 come into contact with each other, to form a composite 21.

The image-receiving sheet 24 preferably is a positive-type presensitized plate, which can be selected from positive-type presensitized plates conventionally employed in the printing field. Materials of the substrate 22 of the image-receiving sheet 24 preferably include hydrophilization-treated aluminum plate, plastic film and waterproof paper.

The positive-type photosensitive thermal-adhesive layer 23 of the image-receiving sheet 24 is a photosensitive coated layer that undergoes photolysis by exposure to light to become soluble in an alkaline solution. The positive-type photosensitive thermal-adhesive layer 23 generally comprises either an o-naphthoquinonediazide compound or a combination of an agent generating acid by light and a silylether compound, and an alkali-soluble binder. The alkali-soluble binder generally comprises a novolack-type phenol resin and preferably a novolak-type phenol resin having a melting point of 50 to 120° C. The positive-type photosensitive thermal-adhesive layer 23 generally contains the novolak-type phenol resin in the amount of 10 to 85 weight % and preferably in the amount of 40 to 80 weight %. The novolak-type phenol resin may be employed singly or in combination of resins having different melting points each other. In the case of using the above specific novolak-type phenol resin in the specific amount, a masking image obtained in the step (3) comprising formation of an image on the image receiving layer exhibits a good sharpness and a high bonding strength to the positive-type photosensitive thermal-adhesive layer 23.

Examples of the photosensitive materials contained in the positive-type photosensitive thermal-adhesive layer 23 include various photosensitive materials (e.g., 1,2-naphthoquinone-2-diazide-4-sulfonic acid cumylphenol ester and 1,2-naphthoquinone-2-diazide-4-sulfonic acid isobutyl ester), which are described in, for example, "Photopolymer Technology" (published by Nikkann Kogyo Shinbunsya, 1988). Preferred are o-naphthoquinonediazide compounds. The positive-type photosensitive thermal-adhesive layer 23 may contain other known materials if desired.

The positive-type photosensitive thermal-adhesive layer 23 can be prepared according to the known process for preparing a positive-type photosensitized plate.

As the support film 25 of the transfer material 27 employed in the process (C) of the invention, various materials employed in the process (A) are employable. Further, the thickness of the support film is in the same range as that in the process (A).

A known back layer may be provided on the surface opposite to the surface of the image forming layer side of the support film 25 in the same manner as the process (A). Further, the surface of the image forming layer side of the support film 25 may be subjected to various treatments in the same manner as the process (A).

The image forming layer 26 is the same as the image forming layer 6 employed in the process (A). In more detail, the layer is the same as one in the process (A) in all respects such as a coloring material, an organic polymer binder, the ratio thereof and use of plasticizer and the other additives. Preferred coloring material is carbon black.

The image forming layer 26 of the transfer material 27 is transferred onto the surface of the positive-type photosensitive thermal-adhesive layer to serve as a masking image. Therefore, the image forming layer 26 is preferred to have a transmittance density of not less than the least density required for a masking image and have as a thin thickness as possible to increase an image quality. In more detail, the transmittance density to light in the wavelength region of 350 to 450 nm of the image forming layer preferably is not less than 0.9 and the thickness (dry thickness) of the image forming layer is not more than 2.0 μm. Particularly, the transmittance density in the wavelength region of 350 to 450 nm preferably is not less than 1.5 and the thickness is in the range of 0.2 to 1.5 μm.

The image forming layer 26 can be formed on the support film 25 in the same manner as the formation method of the image forming layer 6 in the process (A).

On the surface opposite to the support film 25 side of the image forming layer 26 of the transfer material 27, a cover film may be provided to prevent occurrence of scratch on the support film in the same manner as the image forming layer 6 in the process (A).

In the step (1) of the process (C) according to the invention, the transfer material 24 is placed on the image-receiving sheet 27 in such a manner that the image forming layer 26 and the positive-type photosensitive thermal-adhesive layer 23 come into face-to-face contact with each other, to form a composite 21. In this case, the bonding strength between the image forming layer 26 and the positive-type photosensitive thermal-adhesive layer 23 is required to be less than that between the substrate 22 and the positive-type photosensitive thermal-adhesive layer 23 and than that between the image forming layer 26 and the support film 25. The composite 21 may be prepared under pressure with recording using thermal head, or prepared with depressing just before the recording. Otherwise, the composite 21 may be prepared with depressing or heating using a laminator before the recording, if desired.

Figure 10:
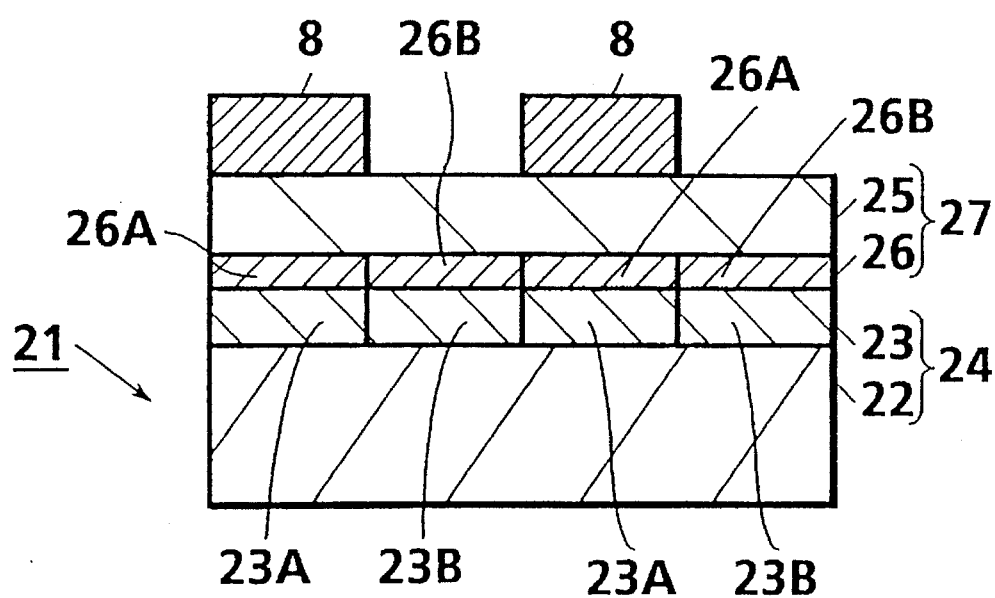
FIG. 10 is a sectional view showing a condition wherein the composite of FIG. 9 is imagewise heated to record an image.

Subsequently, the step (2) of the process (C) is explained referring to FIG. 10 which shows a sectional view of the representative example of the step (2). FIG. 10 shows a condition wherein the composite of FIG. 9 is imagewise heated by placing the thermal head 28 over the support film 25 to record an image. The recording process of the step (2) is performed according to a known thermal-transfer recording process, i.e., the transfer material 27 of the composite is heated by means of the thermal head (exothermic element) 28 according to digital image signals which is inputted to the thermal head, and thus letter or pattern is recorded in the composite.

In FIG. 10, the heat of the thermal head 28 is conducted to the positive-type photosensitive thermal-adhesive layer 23 in the heated area 23A via the image forming layer 26 in the heated area 26A so both the heated areas are softened or melted. Hence, when the temperature in the areas is lowered after the thermal head is removed, the bonding strength between the areas is increased as compared with that between the areas just when the composite has been formed.

The bonding strength between the image forming layer 26 in the heated area 26A and the positive-type photosensitive thermal-adhesive layer 23 in the heated area 23A after heating by the thermal head is increased as compared with that between the image forming layer 26 and the support film 25. In other words, in the preparation of the transfer material 27, the material and composition of each of the support film 25 and the image forming layer 26 are required to be selected in a such a manner that the bonding strength between the image forming layer 26 in the heated area 26A and the positive-type photosensitive thermal-adhesive layer 23 in the heated area 23A after the step (2) (heating by the thermal head) and the bonding strength between the image forming layer 26 and the support film 25 have the relationship as mentioned above. On the other hand, the bonding strength between the image forming layer 26 in the unheated area 26B and the positive-type photosensitive thermal-adhesive layer 23 in the unheated area 23B, which are not heated with the thermal head, is the same as that just on formation of the composite and is unchanged.

Figure 11:
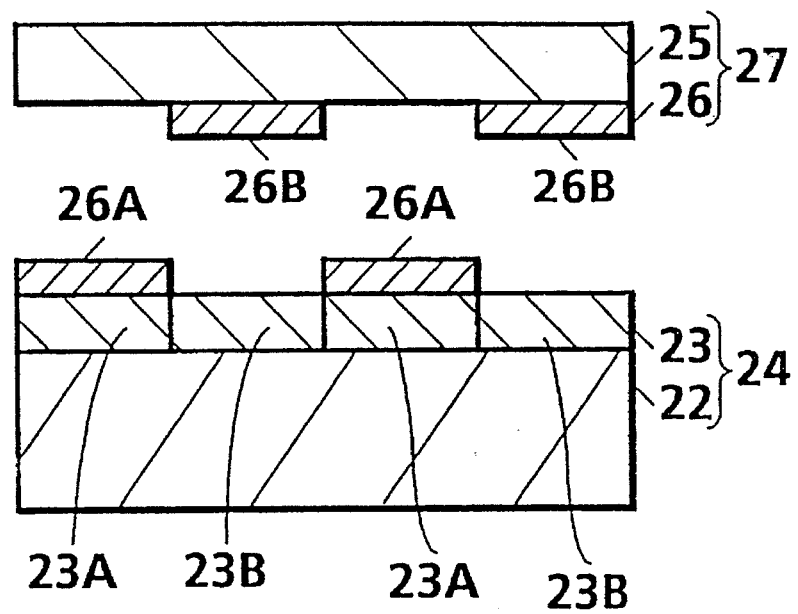
FIG. 11 is a sectional view showing a condition wherein the transfer material is peeled from the image-receiving sheet.

The step (3) of the process (C) according to the invention is explained referring to FIG. 11 which shows a sectional view of the representative example of the step (3). FIG. 11 shows a condition wherein the transfer material 27 is separated from the image-receiving sheet (presensitized plate) 24. In FIG. 11, the bonding strength between the image forming layer 26 in the heated area 26A and the positive-type photosensitive thermal-adhesive layer 23 in the heated area 23A is increased as compared with that between the image forming layer 26 in the unheated area 26B and the positive-type photosensitive thermal-adhesive layer 23 in the unheated area 23B, so that the image forming layer 26 in the heated area 26A is left on the positive-type photosensitive thermal-adhesive layer 23 and the image forming layer 26 of the unheated area 26B is separated from the positive-type photosensitive thermal-adhesive layer 23 together with the support film 25. As a result, on the surface of the positive-type photosensitive thermal-adhesive layer 23 of the image-receiving sheet 24, a colored replica image consisting of the image forming layer 26 in the heated area 26A which corresponds to the image recorded in the step (2) is formed. This image serves as a masking image in the following step (4).

Figure 12:
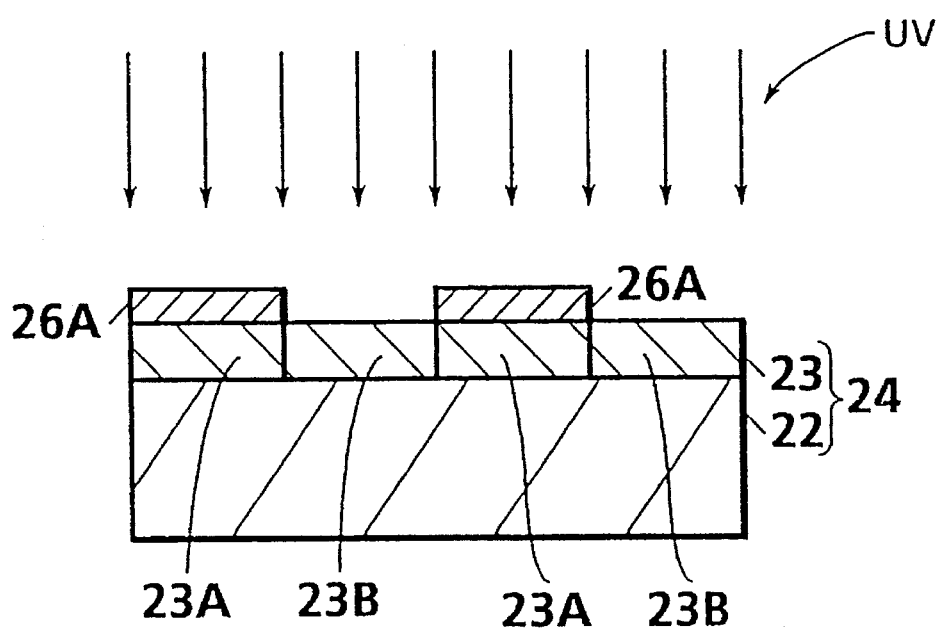
FIG. 12 is a sectional view showing a condition wherein the positive-type photosensitive thermal-adhesive thermal-adhesive layer is exposed to radiation.

The step (4) of the process (C) according to the invention is explained referring to FIG. 12 which shows a sectional view of the representative example of the step (4). FIG. 12 shows a condition wherein the positive-type photosensitive thermal-adhesive layer 23 is exposed to radiation. In more detail, the surface of the positive-type photosensitive thermal-adhesive layer 23 (of the image-receiving sheet) is exposed to UV-rays, i.e., the positive-type photosensitive thermal-adhesive layer 23 is exposed in the unheated area 23B. As a result, the positive-type photosensitive thermal-adhesive layer 23 in the unheated area 23B undergoes photolysis to become soluble in an alkali solution. On the other hand, the thermal-adhesive layer 23 in the heated area 23A has the image forming layer 26 in the heated area 26A (the masking image) thereon so that the thermal-adhesive layer 23 in the heated area 23A is unexposed to UV-rays to be left insoluble in an alkali solution.

Figure 13:
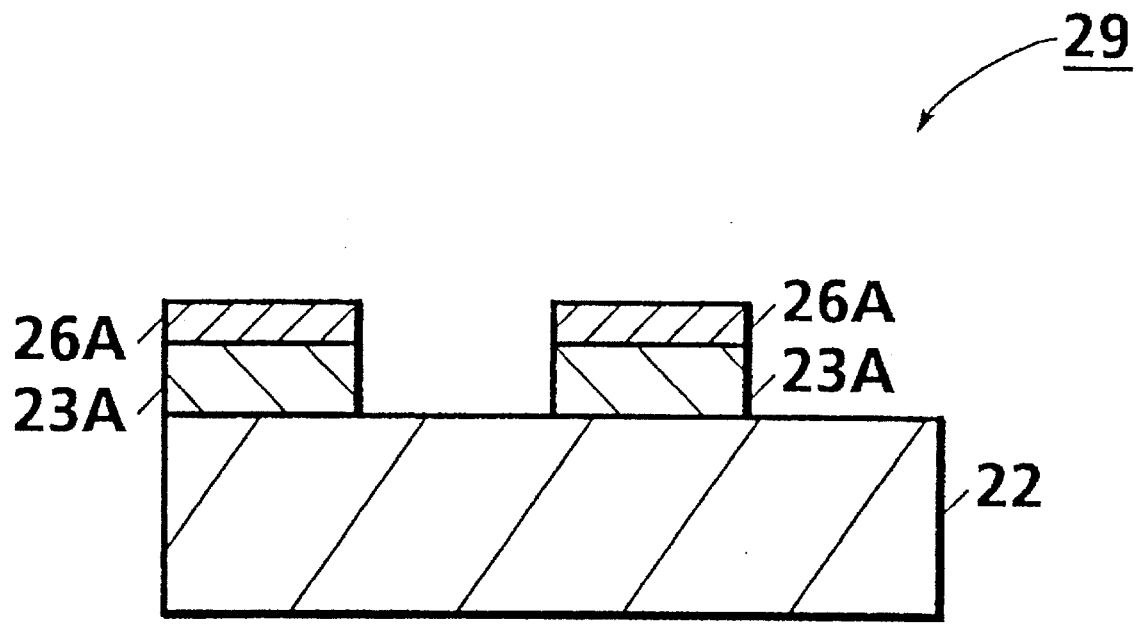
FIG. 13 is a sectional view showing the printing plate (final image recorded product) prepared according to the invention.

Subsequently, in the step (5), the positive-type photosensitive thermal-adhesive layer 23 is developed using a conventional developing solution used in development of a positive-type photosensitive layer, the thermal-adhesive layer 23 in the heated area 23A is dissolved and removed, and both of the thermal-adhesive layer 23 in the heated area 23A and the image forming layer 26 in the heated area 26A, which correspond to an image portion of the image, are left on the substrate 22 of the image-receiving sheet 24. As a result, the printing plate (final image recorded product) 29 as shown in FIG. 13 is prepared. FIG. 13 shows a sectional view of the representative example of the print plate that comprises the substrate 22, the thermal-adhesive layer 23 in the heated area 23A provided thereon and the image forming layer 26 in the heated area 26A provided on the thermal-adhesive layer 23, both of the thermal-adhesive layer 23 in the heated area 23A and the image forming layer 26 in the heated area 26A constituting the image portion.

In the printing plate 29, the image portion is the same as the image forming layer to have lipophilic property, and the non-image portion is the same as the substrate to have hydrophilic property. These properties are extremely different from each other in chemical affinity, and therefore the properties of the image portion and the non-image portion are also greatly different from each other. Hence, use of the printing plate brings about a ease warkability in printing procedure and good durability in repetition of printing.

The present invention is further described by the following examples.

First, the examples of the process according to the invention are described.

EXAMPLE 1

(1) Cyan Transfer Material

(a) Preparation of Coating Solution for Forming Cyan Transfer Layer

Preparation of Mother Liquor

| | |
|---|---|
| Solution of *polyvinyl butyral (20 weight % solution dissolved in n-propyl alcohol) *Polyvinyl butyral (a number average degree of polymerization: approx. 300, butyral degree: 73 weight %; Denka Butyral #2000-L available from Denki Kagaku Kogyo K. K.) | 63 weight parts |
| Cyan pigment (No. 700-Blue-10FG CY-Blue available from Toyo Ink Mfg. Co., Ltd.) | 32 weight parts |
| Glass beads | 100 weight parts |
| Dispersing agent (Solspers S-20,000 available from ICI Co., Ltd.) | 0.8 weight part |
| Dispersing agent (Solspers S-12,000 available from ICI Co., Ltd.) | 0.2 weight part |
| n-Propyl alcohol | 60 weight parts |

The above materials were placed in a paint shaker (available from Toyo Seiki Co., Ltd.) and were subjected to dispersing treatment for two hours to prepare the mother liquor.

Preparation of Coating Solution

| | |
|---|---|
| Mother liquor prepared above | 24 weight parts |
| n-Propyl alcohol | 100 weight parts |
| Surface active agent (Megafack F-176PF available from Dainippon Ink & Chemicals Inc.) | 0.36 weight part |

The above materials were mixed with a stirrer to prepare a coating solution for forming a cyan transfer layer.

The sizes of the pigments contained in the above coating solution were measured using a particle-size measuring apparatus (Type LA-700 available for Horiba Seisakusyo Co., Ltd.). The pigments contained particles of not more than 1 μm in the amount of 85 weight %.

(b) Preparation of Cyan Transfer Material

The above coating solution for an image forming layer was coated on a polyethylene terephthalate film having the thickness of 6 μm using a whirler, and the coated layer was dried in an oven at 100° C. for 2 minutes to form an image forming layer having hue of cyan (thickness: 0.4 μm), whereby a cyan transfer material having the cyan transfer layer was prepared.

(2) Preparation of Image-Receiving Sheet

(a) Preparation of Coating Solution for Forming Photopolymerizable Thermal-Adhesive Layer

| | |
|---|---|
| Methyl methacrylate/ethyl acrylate/ metacrylic acid copolymer (Diyanal BR-77 available from Mitsubishi Rayon Co., Ltd.) | 17 weight parts |
| Alkyl acrylate/alkyl methacrylate copolymer (Diyanal BR-64 available from Mitsubishi Rayon Co., Ltd.) | 17 weight parts |
| Pentaerythritol tetraacrylate (A-TMMT available from Shin Nakamura Kagaku Co., Ltd.) | 22 weight parts |
| Surface active agent (Megafack F-177P available from Dainippon Ink & Chemicals Inc.) | 0.4 weight part |
| Methyl ethyl ketone | 100 weight parts |
| Hydroquinone monomethyl ether | 0.05 weight parts |
| 2,2-dimethoxy-2-phenylacetophnone (Photopolymerization initiator) | 1.5 weight parts |

The above materials were mixed with a stirrer to prepare a coating solution for forming a photopolymerization thermal-adhesive layer.

(b) Preparation of Image-Receiving Material

The above coating solution for the photopolymerization thermal-adhesive layer was coated on a polyethylene terephthalate film having the thickness of 100 μm using a whirler for one minute, and the coated layer was dried in an oven at 100° C. for 2 minutes to form a image-receiving layer, whereby a image-receiving material having the photopolymerization thermal-adhesive layer was prepared. The obtained photopolymerization thermal-adhesive layer had a thickness of 26 μm and the maximum transmittance density of 0.15 to light in the wavelength region of 350 to 450 nm.

(3) Preparation of Composite

The cyan transfer material and the image-receiving sheet as prepared above were placed in layers with hand in such a manner that the image forming layer and the photopolymerizable thermal-adhesive layer come into contact with each other as shown in FIG. 1 to form a composite.

(4) Image Recording

The obtained composite was entered in a machine for evaluating recording characteristics in such a manner that a thermal head was located on the surface of the support film side of the transfer material. The surface of the support film side of the transfer material was imagewise heated with the thermal head in the following conditions to record image, as shown in FIG. 2.

Recording density: 11.8 dot/mm
Applied pressure: 3 kg/cm$^2$
Applied voltage: 24.5 V

(5) Evaluation

The image recording was performed with variation of time for heating the thermal head. Thereafter, the transfer material was peeled from the image-receiving sheet, and the image forming layer in the image area which was transferred on the photopolymerizable thermal-adhesive layer was observed. As a result, it was confirmed that the recording became possible just when time for heating of the thermal head was 0.9 millisecond and the image forming layer in the image area (heated area) was completely transferred on the photopolymerizable thermal-adhesive layer when the time was not less than 1.3 millisecond.

(6) Exposure

Subsequently, the photopolymerization thermal-adhesive layer of the obtained image-receiving sheet was wholly exposed to UV-rays through the substrate in vacuo for 250 seconds using a printer for UV-irradiation (P607 available from Dainippon screen Co., Ltd.).

The photopolymerization thermal-adhesive layer of the image-receiving sheet which was cured by the exposure to UV-rays showed good slip properties because the layer was free from tackiness before exposure. Hence, the image-receiving sheet did not stick to a paper or a plastic film if the sheet and the paper or the plastic film were superposed on each other.

EXAMPLE 2

(1) Magenta Transfer Material

(a) Preparation of Coating Solution for Forming Magentan Image Forming Layer Preparation of Mother Liquor

| | |
|---|---|
| Solution of *polyvinyl butyral (20 weight % solution dissolved in n-propyl alcohol) *Polyvinyl butyral (Denka Butyral #2000-L available from Denki Kagaku Kogyo K. K.) | 63 weight parts |
| Magenta pigment (Lionol Red 6B 4290G available from Toyo Ink Mfg. Co., Ltd.) | 12 weight parts |
| Glass beads | 100 weight parts |
| Dispersing agent (Solspers S-20,000 available from ICI Co., Ltd.) | 0.8 weight part |
| n-Propyl alcohol | 60 weight parts |

The above materials were placed in a paint shaker (available from Toyo Seiki Co., Ltd.) and were subjected to dispersing treatment for two hours to prepare the mother liquor.

Preparation of Coating Solution

| | |
|---|---|
| Mother liquor prepared above | 24 weight parts |
| Methyl ethyl ketone | 24 weight parts |
| Propylene glycol monomethyl ether acetate | 98 weight parts |
| Surface active agent (Megafack F-176PF available from Dainippon Ink & Chemicals Inc.) | 0.3 weight part |

The above materials were mixed with a stirrer to prepare a coating solution for forming a magents transfer layer.

The sizes of the pigments contained in the above coating solution were measured using a particle-size measuring apparatus (Type LA-700 available for Horiba Seisakusyo Co., Ltd.). The pigments contained particles of not more than 1 μm in the amount of 95 weight %.

(b) Preparation of Magenta Transfer Material

The above coating solution for an image forming layer was coated on a polyethylene terephthalate film having the thickness of 6 μm using a whirler, and the coated layer was dried in an oven at 100° C. for 2 minutes to form an image forming layer having hue of magenta (thickness: 0.4 μm), whereby a magenta transfer material having the magentan image forming layer was prepared.

(2) Yellow Transfer Material

(a) Preparation of Coating Solution for Forming Yellow Transfer Layer

Preparation of Mother Liquor

| | |
|---|---|
| Solution of *polyvinyl butyral (20 weight % solution dissolved in n-propyl alcohol) *Polyvinyl butyral (Denka Butyral #2000-L available from Denki Kagaku Kogyo K. K.) | 63 weight parts |
| Yellow pigment | 12 weight parts |

-continued

| | |
|---|---|
| (No. 1401-G-Lionol Yellow available from Toyo Ink Mfg. Co., Ltd.) | |
| Glass beads | 100 weight parts |
| Dispersing agent | 0.8 weight part |
| (Solspers S-20,000 available from ICI Co., Ltd.) | |
| Methyl ethyl ketone | 60 weight parts |

The above materials were placed in a paint shaker (available from Toyo Seiki Co., Ltd.) and were subjected to dispersing treatment for two hours to prepare the mother liquor.

Preparation of Coating Solution

| | |
|---|---|
| Mother liquor prepared above | 31 weight parts |
| Methyl ethyl ketone | 78 weight parts |
| Propylene glycol monomethyl ether acetate | 29 weight parts |
| Surface active agent | 0.2 weight part |
| (Megafack F-176PF available from Dainippon Ink & Chemicals Inc.) | |

The above materials were mixed with a stirrer to prepare a coating solution for forming a yellow transfer layer.

The sizes of the pigments contained in the above coating solution were measured using a particle-size measuring apparatus (Type LA-700 available for Horiba Seisakusyo Co., Ltd.). The pigments contained particles of not more than 1 μm in the amount of 99 weight %.

(b) Preparation of Yellow Transfer Material

The above coating solution for a yellow transfer layer was coated on a polyethylene terephthalate film having the thickness of 6 μm using a whirler, and the coated layer was dried in an oven at 100° C. for 2 minutes to form an image forming layer having hue of yellow (thickness: 0.2 μm), whereby a yellow transfer material having the yellow transfer layer was prepared.

(3) Black Transfer Material (a) Preparation of Coating Solution for Forming Black Transfer Layer Preparation of Mother Liquor

| | |
|---|---|
| Solution of *polyvinyl butyral | 63 weight parts |
| (20 weight % solution dissolved in n-propyl alcohol) | |
| *Polyvinyl butyral (Denka Butyral #2000-L available from Denki Kagaku Kogyo K. K.) | |
| Black pigment | 12 weight parts |
| (MA-100 available from Mitsubishi Chemical Industries,. Ltd.) | |
| Glass beads | 100 weight parts |
| Dispersing agent | 18 weight part |
| (Disparon KS-860 available from ICI Co., Ltd.) | |
| n-Propyl alcohol | 42 weight parts |

The above materials were placed in a paint shaker (available from Toyo Seiki Co., Ltd.) and were subjected to dispersing treatment for two hours to prepare the mother liquor.

Preparation of Coating Solution

| | |
|---|---|
| Mother liquor prepared above | 10 weight parts |
| n-Propyl alcohol | 50 weight parts |
| Methanol | 30 weight parts |
| Surface active agent | 0.15 weight part |
| (Megafack F-176PF available from Dainippon Ink & Chemicals Inc.) | |

The above materials were mixed with a stirrer to prepare a coating solution for forming a black transfer layer.

The sizes of the pigments contained in the above coating solution were measured using a particle-size measuring apparatus (Type LA-700 available for Horiba Seisakusyo Co., Ltd.). The pigments contained particles of not more than 1 μm in the amount of 98 weight %.

(b) Preparation of Black Transfer Material

The above coating solution for a black transfer layer was coated on a polyethylene terephthalate film having the thickness of 6 μm using a whirler, and the coated layer was dried in an oven at 100° C. for 2 minutes to form an image forming layer having hue of black (thickness: 0.2 μm), whereby a black transfer material having the black transfer layer was prepared.

(4) Preparation of Image-Receiving Sheet (a) Preparation of Coating Solution for Forming Subbing Layer

| | |
|---|---|
| Polyvinyl chloride | 9 weight parts |
| (Zeon 25 available from Nippon Zeon Co., Ltd.) | |
| Surface active agent | 0.4 weight part |
| (Megafack F-177P available from Dainippon Ink & Chemicals Inc.) | |
| Methyl ethyl ketone | 60 weight parts |
| Toluene | 35 weight parts |
| Cyclohexanone | 20 weight parts |
| dimethylformamide | 20 weight parts |

The above materials were mixed with a stirrer to prepare a coating solution for forming a subbing layer.

(b) Preparation of Coating Solution for Forming Photopolymerizable Thermal-Adhesive Layer

| | |
|---|---|
| Methyl methacrylate/ethyl acrylate/ metacrylic acid copolymer | 17 weight parts |
| (Diyanal BR-77 available from Mitsubishi Rayon Co., Ltd.) | |
| Alkyl acrylate/alkyl methacrylate copolymer | 17 weight parts |
| (Diyanal BR-64 available from Mitsubishi Rayon Co., Ltd.) | |
| Pentaerythritol tetraacrylate | 22 weight parts |
| (A-TMMT available from Shin Nakamura Kagaku Co., Ltd.) | |
| Surface active agent | 0.4 weight part |
| (Megafack F-177P available from Dainippon Ink & Chemicals Inc.) | |
| Methyl ethyl ketone | 150 weight parts |
| Hydroquinone monomethyl ether | 0.05 weight parts |
| 2,2-dimethoxy-2-phenylacetophnone | 1.5 weight parts |
| (Photopolymerization initiator) | |

The above materials were mixed with a stirrer to prepare a coating solution for forming a photopolymerization thermal-adhesive layer.

(c) Preparation of Image-Receiving Material

The above coating solution for the subbing layer was coated on a polyethylene terephthalate film having the thickness of 100 μm using a whirler, and the coated layer was dried in an oven at 100° C. for 2 minutes to form a subbing layer (thickness: 15 μm).

The above coating solution for the photopolymerization thermal-adhesive layer was coated on the subbing layer using a whirler for one minute, and the coated layer was dried in an oven at 100° C. for 2 minutes to form the photopolymerization thermal-adhesive layer (thickness: 5 μm), whereby a image-receiving material having the photopolymerization thermal-adhesive layer was prepared. The obtained photopolymerization thermal-adhesive layer had the maximum transmittance density of 0.05 to light in the wavelength region of 350 to 450 nm.

(5) Preparation of Composite

The black transfer material and the image-receiving sheet as prepared above were placed in layers with hand in such a manner that the image forming layer and the photopolymerizable thermal-adhesive layer come into contact with each other as shown in FIG. 1 to form a composite.

(6) Image Recording

The obtained composite was entered in a machine for evaluating recording characteristics in such a manner that a thermal head was located on the surface of the support film side of the transfer material. The surface of the support film side of the transfer material was imagewise heated with the thermal head in the following conditions to record image, as shown in FIG. 2.

Recording density: 11.8 dot/mm
Applied pressure: 3 kg/cm$^2$
Applied voltage: 24.5 V
Applied time: 1.3 millisecond (7) Formation of Black Image After image recording, the black transfer material was peeled from the image-receiving sheet. It was confirmed that the black transfer layer in the image area (heated area) was accurately transferred on the photopolymerizable thermal-adhesive layer to form a black image.

(8) Preparation of Composite

Subsequently, the image-receiving sheet on which the black image was formed (obtained above (7)) and a cyan transfer layer prepared in the same manner as Example 1 were placed in layers with hand in such a manner that the cyan transfer layer and the photopolymerizable thermal-adhesive layer come into contact with each other as shown in FIG. 5 to form a composite.

(9) Image Recording

The composite obtained above (8) was entered in a machine for evaluating recording characteristics in such a manner that a thermal head was located on the surface of the support film side of the transfer material. The surface of the support film side of the transfer material was imagewise heated with the thermal head as shown in FIG. 6, to record image in the same conditions as above (6).

(10) Formation of Cyan Image

After image recording, the cyan transfer material was peeled from the image-receiving sheet. It was confirmed that the cyan transfer layer in the image area (heated area) was accurately transferred on the photopolymerizable thermal-adhesive layer to form a cyan image having high quality in addition to a black image.

(11) Formation of Magenta Image

Subsequently, the image-receiving sheet on which the black image and cyan image were formed (obtained above (10)) and a magent an image forming layer were subjected to the same procedures as those of above (8), (9) and (10). As a result, it was confirmed that the magent an image forming layer in the image area (heated area) was accurately transferred on the photopolymerizable thermal-adhesive layer having the cyan image and the black image to form a magenta image. All the images having different hues from each other showed high quality.

(12) Formation of Yellow Image

Subsequently, the image-receiving sheet on which the black image, cyan image and magenta image were formed (obtained above (11)) and a yellow transfer layer were subjected to the same procedures as those of above (8), (9) and (10). As a result, it was confirmed that the yellow transfer layer in the image area (heated area) was accurately transferred on the photopolymerizable thermal-adhesive layer having the cyan image, black image and magenta image to form a yellow image. All the images having different hues from each other showed high quality.

(13) Exposure

Subsequently, the image-receiving sheet having multi-color images obtained above (12) was placed on a coated paper in such a manner that the photopolymerization thermal-adhesive layer and the surface of the coated paper came into contact with each other to form a composite. Then, the image-receiving sheet of the composite was wholly exposed to UV-rays through the substrate in vacuo for 250 seconds using a printer for irradiation of UV-rays (P607 available from Dainippon screen Co., Ltd.) to cure the photopolymerization thermal-adhesive layer.

(14) Evaluation

The image-receiving sheet was peeled from the coated paper. The peeling occurred between the cured photopolymerization thermal-adhesive layer and the subbing layer. Therefore, the multi-color images were transferred onto the coated paper together with the cured photopolymerization thermal-adhesive layer. Each of the image did not show discoloration and the cured photopolymerization thermal-adhesive layer showed good adhesion to the coated paper and good resistance to scratch.

EXAMPLE 3

(1) Black Transfer Material

(a) Preparation of Coating Solution for Forming Black Transfer Layer

Preparation of Mother Liquor

| | |
|---|---|
| Solution of *polyvinyl butyral (20 weight % solution dissolved in n-propyl alcohol) | 63 weight parts |
| Black pigment (MA-100 available from Mitsubishi Chemical Industries,. Ltd.) | 32 weight parts |
| Glass beads | 100 weight parts |
| Dispersing agent (Solspers S-20,000 available from ICI Co., Ltd.) | 0.8 weight part |
| Methyl ethyl ketone | 60 weight parts |

The above materials were placed in a paint shaker (available from Toyo Seiki Co., Ltd.) and were subjected to dispersing treatment for two hours to prepare the mother liquor.

Preparation of Coating Solution

| | |
|---|---|
| Mother liquor prepared above | 10 weight parts |
| n-Propyl alcohol | 60 weight parts |
| Surface active agent (Megafack F-176PF available from Dainippon Ink & Chemicals Inc.) | 0.2 weight part |

The above materials were mixed with a stirrer to prepare a coating solution for forming a black transfer layer.

(b) Preparation of Black Transfer Material

The above coating solution for an image forming layer was coated on a polyethylene terephthalate film having the thickness of 6 μm using a whirler, and the coated layer was dried in an oven at 100° C. for 2 minutes to form an image forming layer having hue of black (thickness: 0.6 μm), whereby a black transfer material having the image forming layer was prepared. The transmittance density to UV-rays of the image forming layer was measured with Macbeth densitometer to obtain 2.9.

The above black transfer material and the image-receiving sheet prepared in the same manner as Example 1 were subjected to the procedures of (3) Preparation of composite, (4) Record of image, (5) Evaluation and (6) Exposure in the same manner as Example 1. However, applied time of thermal head was changed to 1,7 millisecond. Thus, the final product that a black image was formed on the image-receiving sheet was obtained. The final product showed distinct contrast of the image and excellent resistance to scratch as well as good slipperiness so that the product can be advantageously employed for a masking film of a printing plate.

EXAMPLE 4

(1) Preparation of Image-Receiving Sheet

(a) Preparation of Coating Solution for Forming Photopolymerizable Thermal-Adhesive Layer

| | |
|---|---|
| Methyl methacrylate/ethyl acrylate/metacrylic acid copolymer (Diyanal BR-77 available from Mitsubishi Rayon Co., Ltd.) | 17 weight parts |
| Alkyl acrylate/alkyl methacrylate copolymer (Diyanal BR-64 available from Mitsubishi Rayon Co., Ltd.) | 17 weight parts |
| Pentaerythritol tetraacrylate (A-TMMT available from Shin Nakamura Kagaku Co., Ltd.) | 22 weight parts |
| Surface active agent (Megafack F-177P available from Dainippon Ink & Chemicals Inc.) | 0.4 weight part |
| Methyl ethyl ketone | 300 weight parts |
| Hydroquinone monomethyl ether | 0.05 weight parts |
| 2,2-dimethoxy-2-phenylacetophnone (Photopolymerization initiator) | 1.5 weight parts |

The above materials were mixed with a stirrer to prepare a coating solution for forming a photopolymerization thermal-adhesive layer.

(b) Preparation of Image-Receiving Sheet

Polyethylene was laminated on a paper having the thickness of 75 μm through heat fusion to form a polyethylene laminate layer of a thickness of 30 μm. The surface of the polyethylene laminate layer was treated with glow discharge to improve adhesion. On the treated surface, a layer comprising gelatin (thickness: 0.5 μm) was formed by a coating method to prepare a substrate for an image-receiving sheet.

The above coating solution for a photopolymerization thermal-adhesive layer was coated on the layer comprising gelatin using a whirler, and the coated layer was dried in an oven at 100° C. for 2 minutes to form the photopolymerization thermal-adhesive layer having thickness of 0.6 μm, whereby the image-receiving sheet was prepared.

The above image-receiving sheet and the cyan transfer material prepared in the same manner as Example 1 were subjected to the procedures of (3) Preparation of composite, (4) Record of image, (5) Evaluation and (6) Exposure in the same manner as Example 1. However, applied time of thermal head was changed to 1 millisecond. Thus, the final product that a cyan image was formed on the image-receiving sheet was obtained. The final product showed distinct contrast of the image and excellent resistance to scratch and further scarcely had the image defect originated from adhesion of foreign matter.

EXAMPLE 5

(1) Preparation of Transfer Material

(a) Preparation of Coating Solution for Forming Black Transfer Layer

Preparation of Mother Liquor

| | |
|---|---|
| Solution of *polyvinyl butyral (20 weight % solution dissolved in n-propyl alcohol) | 42 weight parts |

*Polyvinyl butyral (Denka Butyral #2000-L

-continued

| | |
|---|---|
| available from Denki Kagaku Kogyo K. K.) | |
| Black pigment | 16 weight parts |
| (MA-100 available from Mitsubishi | |
| Chemical Industries,. Ltd.) | |
| Glass beads | 100 weight parts |
| Dispersing agent | 0.53 weight part |
| (Solspers S-20,000 available from ICI | |
| Co., Ltd.) | |
| n-Propyl alcohol | 40 weight parts |

The above materials were placed in a paint shaker (available from Toyo Seiki Co., Ltd.) and were subjected to dispersing treatment for two hours to prepare the mother liquor.

Preparation of Coating Solution

| | |
|---|---|
| Mother liquor prepared above | 10 weight parts |
| n-Propyl alcohol | 38 weight parts |
| Surface active agent | 0.2 weight part |
| (Megafack F-176PF available from | |
| Dainippon Ink & Chemicals Inc.) | |

The above materials were mixed with a stirrer to prepare a coating solution for forming an image forming layer.

(b) Preparation of Transfer Material

The above coating solution for an image forming layer was coated on a free surface of a polyethylene terephthalate film having the thickness of 6 μm in which fusion-preventing layer comprising thermosetting resin was formed on another surface of the film using a whirler, and the coated layer was dried in an oven at 100° C. for two minutes to form an image forming layer having hue of black (thickness: 0.6 μm), whereby a transfer material having the black transfer layer was prepared. An absorption spectrum of the image forming layer was measured by a spectrophotometer which resulted in maximum transmittance density of 2.8 to light in the wavelength region of 350 to 450 nm.

(2) Preparation of Positive-Type Presensitized Plate (Image-Receiving Sheet)

(a) Preparation of Positive-Type Photosensitive Thermal-Adhesive Layer

| | |
|---|---|
| Novolak-type phenol resin | 2.5 weight parts |
| (Melting point: 76° C.; PR-50,716 available | |
| from Sumitomo Duless Co., Ltd.) | |
| Novolak-type phenol resin | 3.5 weight parts |
| (Melting point: 55° C.; PR-51,600B available | |
| from Sumitomo Duless Co., Ltd.) | |
| 1,2-Naphthoquinone-2-diazide-4-sulfonic acid cumylphenol ester | 2.0 weight parts |
| Methyl ethyl ketone | 40 weight parts |
| Propylene glycol monomethyl ether acetate | 20 weight parts |
| Surface active agent | 0.1 weight part |
| (Megafack F-176PF available from | |
| Dainippon Ink & Chemicals Inc.) | |
| Colorant | 0.07 weight part |
| (Malachite Green) | |

The above materials were mixed with a stirrer to prepare a coating solution for forming a positive-type photosensitive thermal-adhesive layer.

(b) Preparation of Positive-Type Presensitized Plate (Image-Receiving Sheet)

An anodized (hydrophilization-treated) aluminum plate was prepared as a substrate of the presensitized plate. On the anodized surface of the aluminum plate, the coating solution for forming a positive-type photosensitive thermal-adhesive layer was coated using a whirler, and the coated layer was dried in an oven at 100° C. for 2 minutes to prepare a positive-type presensitized plate. A coated amount of the positive-type photosensitive thermal-adhesive layer was 1.7 g/m² in dry state.

(3) Preparation of Composite

The above transfer material and the above positive-type presensitized plate (image-receiving sheet) were placed in layers using a laminator at room temperature in such a manner that the image forming layer and the positive-type photosensitive thermal-adhesive layer come into contact with each other as shown in FIG. 9 to form a composite.

(4) Image Recording

A thermal head, to which digital image signals from a computer were inputted, was located on the surface of the support film side of the transfer material, as shown in FIG. 10, to record image in the following conditions.

Resolution: 300 dot/inch
Applied voltage: 24.5 V
Applied pressure: 3 kg/cm²

(5) Evaluation

The image recording was performed with variation of applied pulse time for heating the thermal head. Thereafter, the transfer material was peeled from the positive-type presensitized plate and the image forming layer in the image area (heated area) which was transferred on the positive-type photosensitive thermal-adhesive layer was observed (see FIG. 11). As a result, it was confirmed that the image forming layer in the image area (heated area) was accurately transferred on the positive-type photosensitive thermal-adhesive layer to form a masking image when the applied pulse time for heating the thermal head was not less than 0.5 millisecond.

(6) Exposure

Subsequently, the positive-type photosensitive thermal-adhesive layer of the obtained positive-type presensitized plate (image-receiving sheet) was wholly exposed to UV-rays through the image forming layer (masking image) in vacuo for four minutes using a printer for UV-irradiation (P607 available from Dainippon screen Co., Ltd.).

(7) Development

The exposed positive-type presensitized plate was developed in an alkaline developing solution at 25° C. for one minute.

Composition of Alkaline Developing Solution

| | |
|---|---|
| Sodium carbonate | 59 weight parts |
| Sodium bicarbonate | 32 weight parts |
| Water | 720 weight parts |
| Butyl cellosolve | 1 weight part |

As a result of the development, the photosensitized portion of the photosensitive thermal-adhesive layer, on which the image forming layer was not formed, was dissolved in the developing solution to be removed. Thus, prepared was a printing plate that the image consisting of the image forming layer and the photosensitive thermal-adhesive layer, both layers corresponding to the masking image, was formed on the substrate.

(8) Evaluation

The image of the resultant printing plate was subjected to visual observation and observation with a 20× magnifier (Loupe). It was confirmed that the image accurately corresponded to signals inputted from the computer to the thermal head.

A coated paper was printed by an offset press using the obtained printing plate and both of a conventional black ink and dampening water. The resultant printed product had no scumming or tinting in the non-image area. Further, there was no deterioration of halftone in the light portion or the shadow portion even when 10,000 sheets of coated paper were printed. Hence, it is apparent that the resultant printing plate has satisfactory printerbility.

We claim:

1. A thermal-transfer recording process comprising the steps of:

(1) placing a transfer material comprising a support film and an image forming layer provided thereon which contains a coloring material and an organic polymer on an image-receiving sheet comprising a substrate and a positive-type photosensitive thermal-adhesive layer in such a manner that the image forming layer and the photosensitive thermal-adhesive layer come into contact with each other, to form a composite;

(2) imagewise heating the surface of the support film side of the composite using a thermal head to increase a bonding strength between the image forming layer and the photosensitive thermal-adhesive layer in the heated portion;

(3) separating the transfer material from the image-receiving sheet leaving the image forming layer in the heated portion on the photosensitive thermal-adhesive layer to form a colored replica image on the image-receiving sheet;

(4) exposing the whole surface of the photosensitive thermal-adhesive layer on the substrate to ultraviolet rays via the colored replica image; and (5) treating the exposed layer with a developing solution to remove the exposed layer in the area having no colored replica image thereon.

2. The thermal-transfer recording process as defined in claim 1, wherein the support film has a thickness of 2 to 50 μm.

3. The thermal-transfer recording process as defined in claim 1, wherein the image forming layer has a thickness not more than 2.0 μm and has a transmittance density of not less than 0.9 to a light of wavelength region of 330 to 450 nm.

4. The thermal-transfer recording process as defined in claim 1, wherein the positive-type photosensitive thermal-adhesive layer contains novolak-type phenol resin in the amount of 10 to 85 weight %.

5. The thermal-transfer recording process defined in claim 1, wherein the photosensitive thermal-adhesive layer contains a o-naphthoquinonediazide compound as a photosensitive material.

* * * * *